(12) United States Patent
Yahashi

(10) Patent No.: US 9,887,098 B2
(45) Date of Patent: Feb. 6, 2018

(54) METHOD FOR MANUFACTURING INTEGRATED CIRCUIT DEVICE

(71) Applicant: TOSHIBA MEMORY CORPORATION, Minato-ku (JP)

(72) Inventor: Katsunori Yahashi, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 113 days.

(21) Appl. No.: 14/847,582

(22) Filed: Sep. 8, 2015

(65) Prior Publication Data

US 2016/0379843 A1   Dec. 29, 2016

Related U.S. Application Data

(60) Provisional application No. 62/183,910, filed on Jun. 24, 2015.

(51) Int. Cl.
| | |
|---|---|
| *H01L 27/115* | (2017.01) |
| *H01L 21/8247* | (2006.01) |
| *H01L 21/3065* | (2006.01) |
| *H01L 21/311* | (2006.01) |
| *H01L 21/265* | (2006.01) |
| *H01L 27/11582* | (2017.01) |
| *H01L 27/11556* | (2017.01) |
| *H01L 27/11519* | (2017.01) |
| *H01L 27/11565* | (2017.01) |
| *H01L 29/66* | (2006.01) |

(52) U.S. Cl.
CPC ...... *H01L 21/31144* (2013.01); *H01L 21/265* (2013.01); *H01L 21/31111* (2013.01); *H01L 21/31116* (2013.01); *H01L 27/11519* (2013.01); *H01L 27/11556* (2013.01); *H01L 27/11565* (2013.01); *H01L 27/11582* (2013.01); *H01L 29/66825* (2013.01); *H01L 29/66833* (2013.01)

(58) Field of Classification Search
CPC ........... H01L 27/11568; H01L 27/1157; H01L 27/11578–27/11582
See application file for complete search history.

(56) References Cited

U.S. PATENT DOCUMENTS

| | | | |
|---|---|---|---|
| 8,207,029 B2* | 6/2012 | Ishikawa | ........... H01L 27/11556 257/E21.21 |
| 8,211,783 B2 | 7/2012 | Sakurai et al. | |

(Continued)

*Primary Examiner* — Zandra Smith
*Assistant Examiner* — Molly Reida
(74) *Attorney, Agent, or Firm* — Oblon, McClelland, Maier & Neustadt, L.L.P.

(57) ABSTRACT

According to one embodiment, a method is disclosed for manufacturing an integrated circuit device, the method can include forming a mask member on a first film, the mask member having a pattern, performing a first etching on the first film using the mask member as a mask to form a recessed section in the first film, forming a second film covering an inner side surface of the recessed section. The second film has a film thickness of preventing blockage of the recessed section, and performing a second etching on the second film and the first film via the recessed section. The performing of the second etching includes performing a third etching in a condition of an etching rate at a place smaller in curvature radius in the recessed section being lower than an etching rate at a place larger in curvature radius in the recessed section.

11 Claims, 24 Drawing Sheets

(56) References Cited

U.S. PATENT DOCUMENTS

| | | | |
|---|---|---|---|
| 8,247,860 B2 | 8/2012 | Iwase et al. | |
| 8,441,061 B2 | 5/2013 | Nakao et al. | |
| 2010/0197219 A1* | 8/2010 | Issa ........................ | H04H 20/57 455/3.06 |
| 2011/0244691 A1* | 10/2011 | Mochiki ........... | H01J 37/32091 438/710 |
| 2014/0087562 A1 | 3/2014 | Ikarashi | |
| 2014/0134842 A1* | 5/2014 | Zhang ............... | H01J 37/32357 438/694 |
| 2015/0357410 A1* | 12/2015 | Mizutani ............. | H01L 29/0657 257/622 |

* cited by examiner

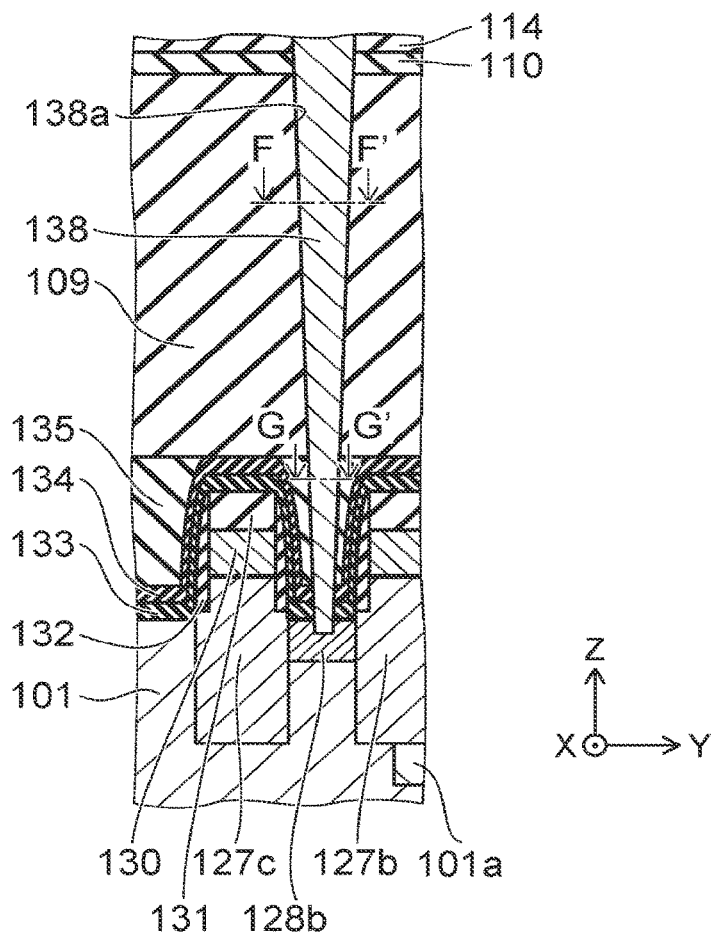
FIG. 4A
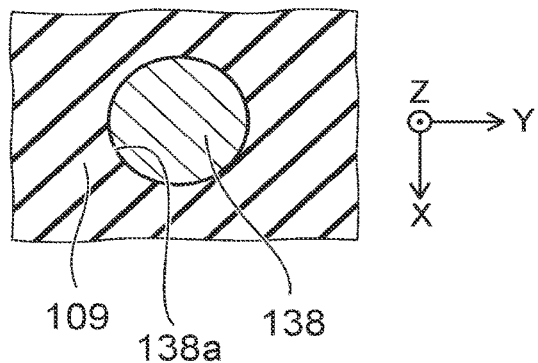
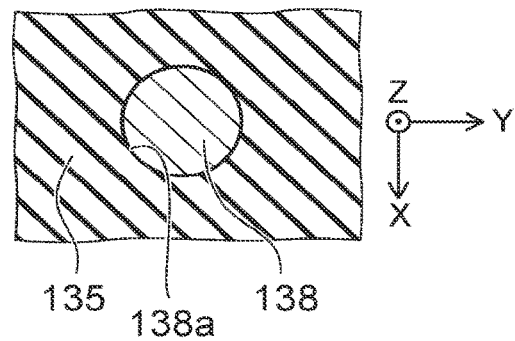
FIG. 4B                FIG. 4C

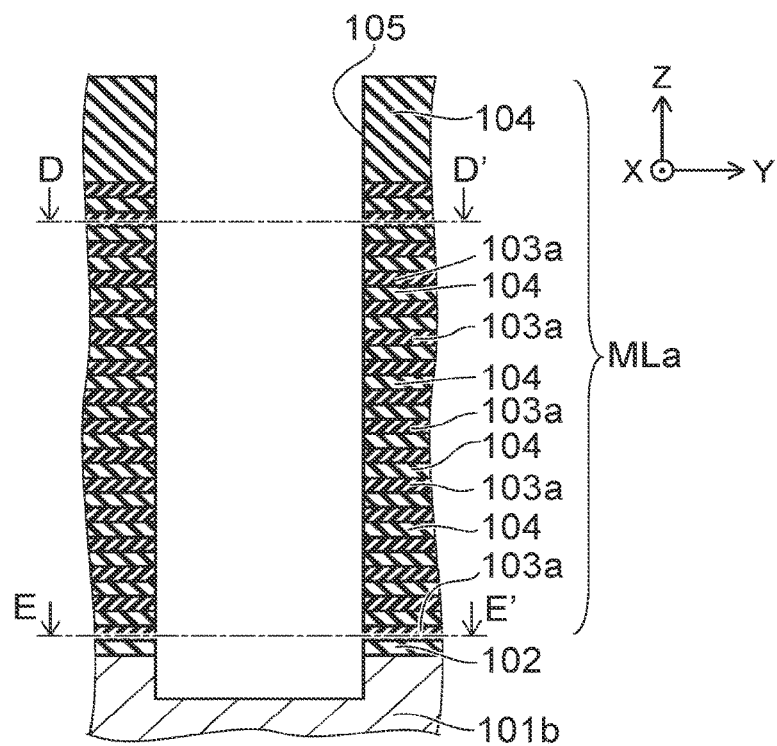
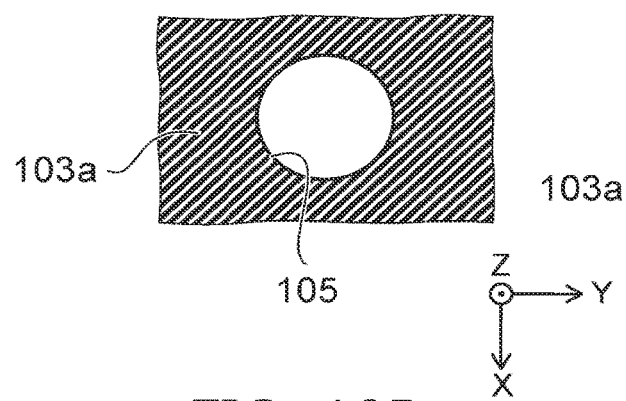
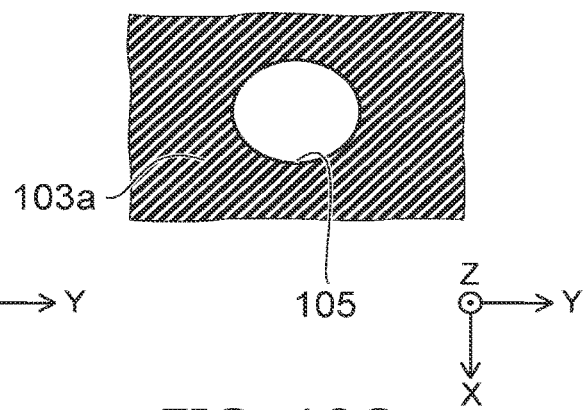
FIG. 10A
FIG. 10B
FIG. 10C

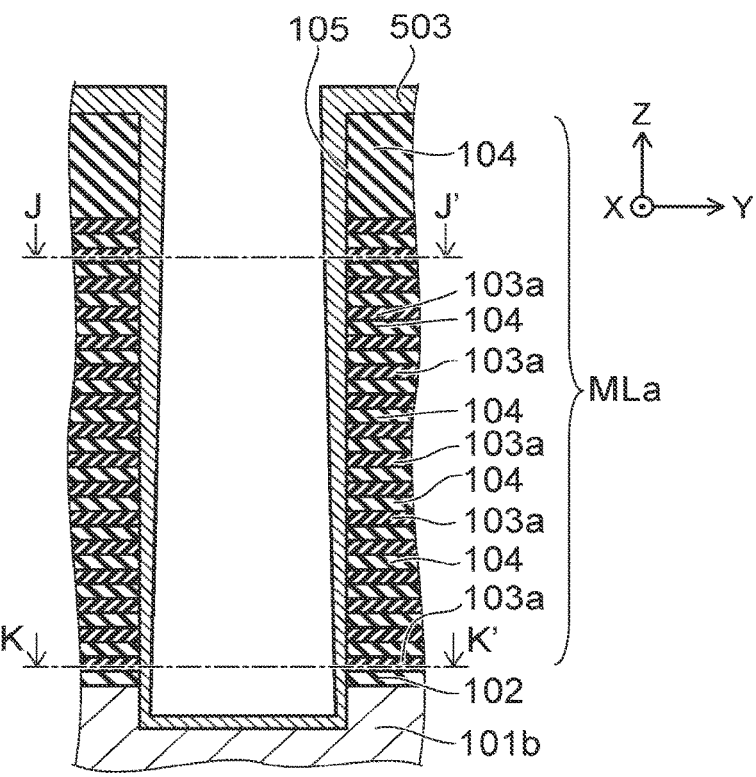
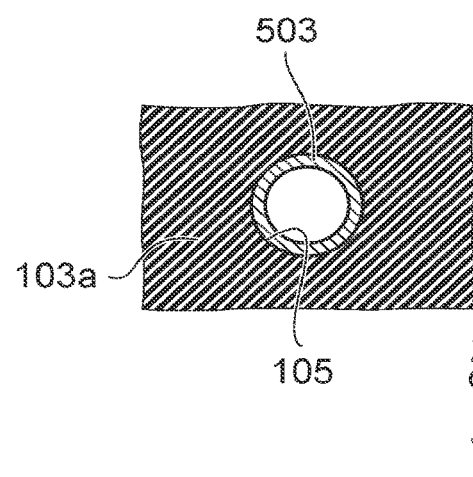
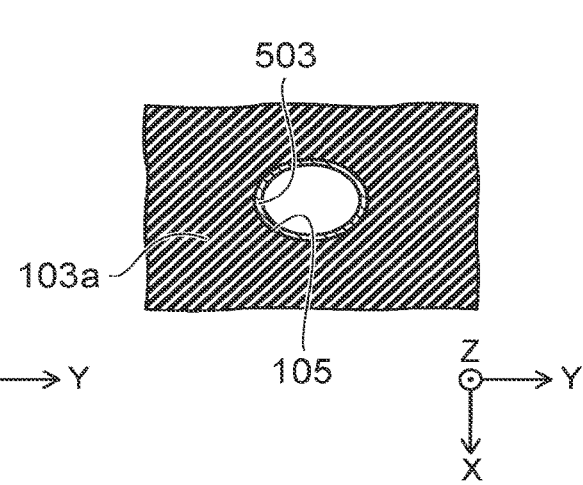
FIG. 21A
FIG. 21B
FIG. 21C

METHOD FOR MANUFACTURING INTEGRATED CIRCUIT DEVICE

CROSS-REFERENCE TO RELATED APPLICATION

This application is based upon and claims the benefit of priority from U.S. Provisional Patent Application 62/183,910, filed on Jun. 24, 2015; the entire contents of which are incorporated herein by reference.

FIELD

Embodiments described herein relate generally to a method for manufacturing an integrated circuit device.

BACKGROUND

In recent years, there has been proposed a storage device increased in density by stacking memory cells in three-dimensional directions. According to this technology, since the area of the substrate can more efficiently be utilized compared to a storage device having a two-dimensional planar shape, it becomes possible to dramatically increase the density of the storage device. Due to adoption of such a three-dimensional configuration of the device, formation of a hole or the like high in aspect ratio has been demanded.

BRIEF DESCRIPTION OF THE DRAWINGS

FIG. 4A is an enlarged cross-sectional view of an area C shown in FIG. 1 of the integrated circuit device according to the first embodiment, FIG. 4B is a cross-sectional view in the F-F' line shown in FIG. 4A, and FIG. 4C is a cross-sectional view in the G-G' line shown in FIG. 4A;

FIG. 5A through FIG. 16C are process cross-sectional views illustrating the method for manufacturing the integrated circuit device according to the first embodiment;

FIG. 21A through FIG. 22C are process cross-sectional views illustrating a method for manufacturing an integrated circuit device according to the variation of the second embodiment.

DETAILED DESCRIPTION

According to one embodiment, a method is disclosed for manufacturing an integrated circuit device, the method can include forming a mask member on a first film, the mask member having a pattern, performing a first etching on the first film using the mask member as a mask to form a recessed section in the first film, forming a second film covering an inner side surface of the recessed section. The second film has a film thickness of preventing blockage of the recessed section, and performing a second etching on the second film and the first film via the recessed section. The performing of the second etching includes performing a third etching in a condition of an etching rate at a place smaller in curvature radius in the recessed section being lower than an etching rate at a place larger in curvature radius in the recessed section.

Various embodiments will be described hereinafter with reference to the accompanying drawings.

First Embodiment

Firstly, a first embodiment will be explained.

Figure 1:
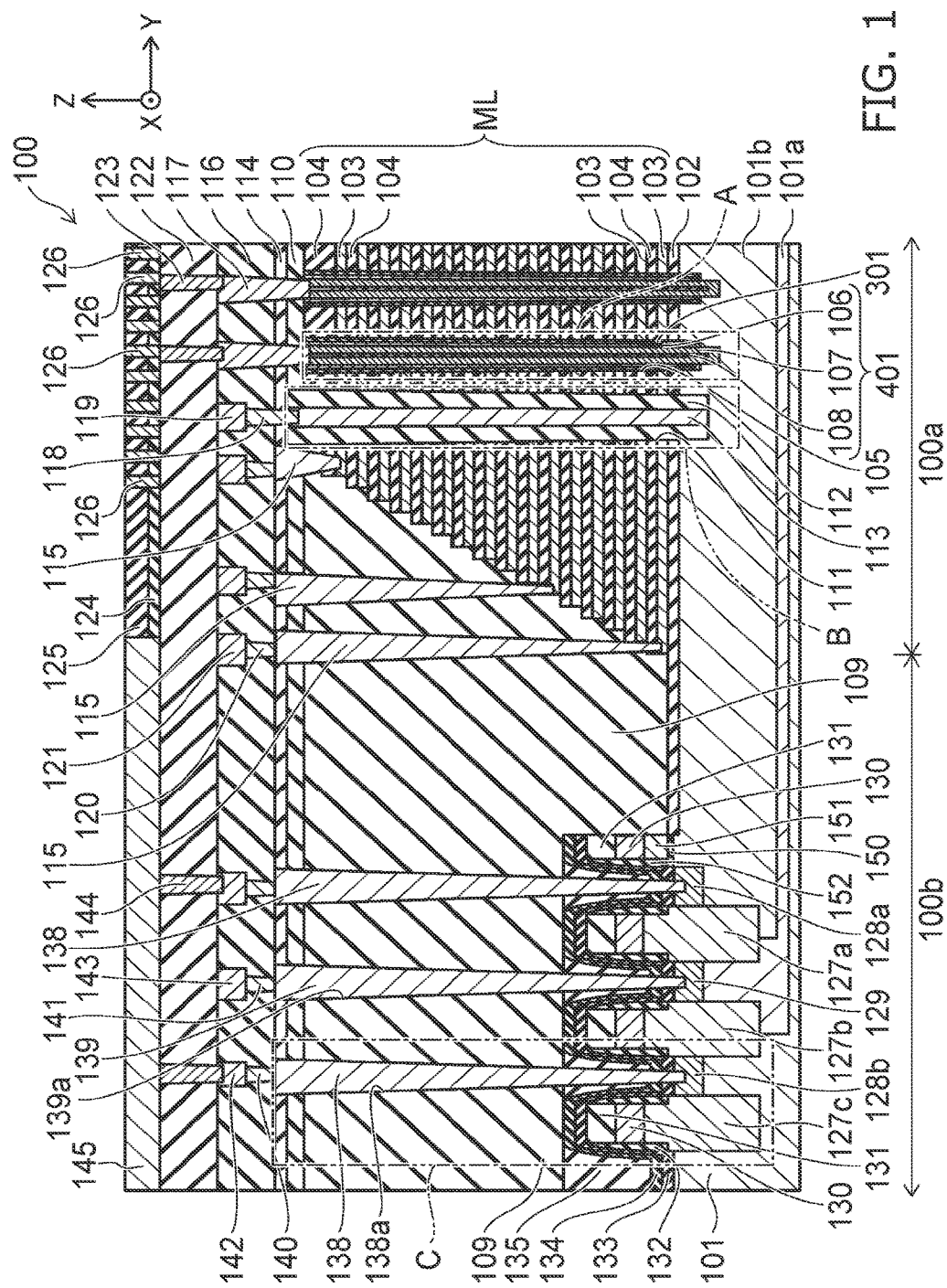
FIG. 1 is a cross-sectional view illustrating an integrated circuit device according to a first embodiment.

FIG. 1 is a cross-sectional view illustrating an integrated circuit device according to the embodiment.

Figure 2A:
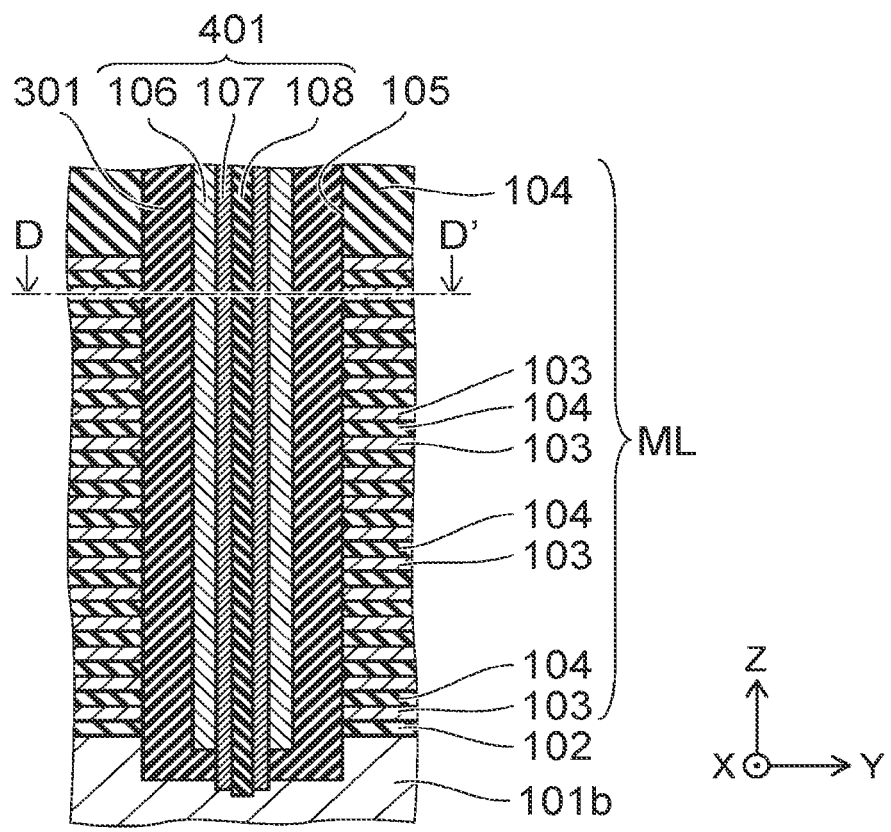
FIG. 2A is an enlarged cross-sectional view of an area A shown in FIG. 1 of the integrated circuit device according to the first embodiment.
Figure 2B:
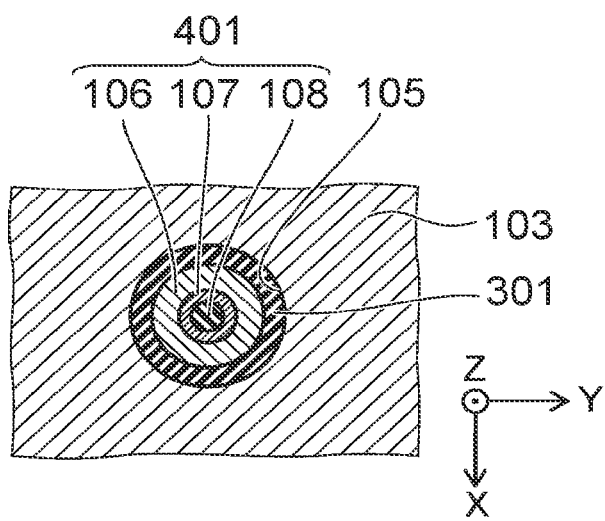
FIG. 2B is a cross-sectional view in the D-D' line shown in FIG. 2A.

FIG. 2A is an enlarged cross-sectional view of an area A shown in FIG. 1 of the integrated circuit device according to the embodiment, and FIG. 2B is a cross-sectional view in the D-D' line shown in FIG. 2A.

As shown in FIG. 1, in the integrated circuit device according to the embodiment, there are set a memory cell area 100a where stacked memory cells are disposed, and a peripheral transistor area 100b where peripheral transistors are disposed.

In the integrated circuit device 100 according to the embodiment, there is disposed a semiconductor substrate 101 made of silicon, and having a conductivity type of, for example, p$^-$-type.

Hereinafter, in the specification, an XYZ Cartesian coordinate system is introduced for the sake of convenience of explanation. In the coordinate system, two directions parallel to a principal surface of the semiconductor substrate 101 and perpendicular to each other are defined as an X-direction and a Y-direction, and a direction perpendicular to both of the X-direction and the Y-direction, namely the stacking direction of the layers, is defined as a Z-direction.

Firstly, a configuration of the memory cell area 100a of the integrated circuit device 100 according to the embodiment will be explained.

In the memory cell area 100a, an impurity layer 101a having a conductivity type of n-type is disposed on the semiconductor substrate 101. On the impurity layer 101a, there is disposed an impurity layer 101b having a conductivity type of p-type. The impurity layer 101a and the impurity layer 101b have contact with each other.

On the impurity layer 101b, there is disposed an interlayer insulating film 102. On the interlayer insulating film 102, there is disposed a stacked body ML having electrode films 103 and inter-electrode insulating films 104 stacked alternately. Further, there are formed memory holes 105 each penetrating the stacked body ML and the interlayer insulating film 102. The memory holes 105 each reach an upper part of the impurity layer 101b. On the inner side surface of the memory hole 105, there is disposed a memory film 301. Further, the inside of the memory hole 105 is filled with a pillar 401. The pillar 401 includes semiconductor films 106, 107, and a core oxidation member 108. The semiconductor film 106 is disposed on a side surface of the memory film 301. The semiconductor film 107 is disposed on a side surface of the semiconductor film 106 in the memory hole 105 and the bottom surface of the memory hole 105. Further, the core oxidation member 108 is disposed on a side surface of the semiconductor film 107 in the memory hole 105.

It should be noted that the memory film 301 is a film capable of retaining information, and is formed by stacking, for example, a block insulating film, a charge storage film, and a tunnel insulating film on the inner side surface of the memory hole 105 in this order.

On the peripheral transistor area 100*b* side of the stacked body ML, the electrode film 103 and the inter-electrode insulating film 104 disposed on an upper surface of the electrode film 103 form a pair of layers, and the pairs of layers are formed so that the length of the pair of layers in the Y-direction gradually descends from the lower layer toward the upper layer. Thus, an end part of the stacked body ML on the peripheral transistor area 100*b* side is formed to have a stepped shape.

In an area of an upper surface of the interlayer insulating film 102, in which the stacked body ML is not disposed, there is disposed an insulating film 109. The insulating film 109 also covers the end part having the stepped shape of the stacked body ML. Further, in the Z-direction, the position of an upper surface of the insulating film 109 is roughly the same as the position of an upper surface of the uppermost layer of the stacked body ML.

On the stacked body ML and the insulating film 109, there is disposed an insulating film 110. Further, there is formed a slit 111 penetrating the insulating film 110, the stacked body ML, and the interlayer insulating film 102. The slit 111 reaches an upper part of the impurity layer 101*b*. On the inner side surfaces of the slit 111, there are disposed insulating members 112. Inside the slit 111, there is disposed a source line 113.

On the insulating film 110, there is disposed an insulating film 114. Further, there is disposed a plurality of contacts 115 each penetrating the insulating films 114, 110 and the insulating film 109. The contacts 115 also penetrate the inter-electrode insulating film 104, and respectively have contact with the electrode films 103 of the respective steps in the part where the stacked body ML is formed to have the stepped shape.

On the insulating film 114, there is disposed an insulating film 116. Further, in the region located directly above each of the memory holes 105, there is disposed a plug 117 penetrating the insulating films 116, 114, and 110. The plug 117 has contact with the semiconductor films 106, 107, and the core oxidation member 108.

In the region located directly above the slit 111, there is disposed a plug 118 penetrating a lower part of the insulating film 116, and the insulating film 114. The plug 118 is connected to the source line 113. In the region located directly above the plug 118 in the upper part of the insulating film 116, there is disposed a source line 119 extending in the X-direction. The source line 119 is connected to the source line 113 via the plug 118.

In the region located directly above each of the contacts 115 in the lower part of the insulating film 116, there is disposed a plug 120. The plugs 120 are connected to the respective contacts 115. In the region located directly above the plug 120 in the upper part of the insulating film 116, there is disposed an interconnection 121 extending in the X-direction.

On the insulating film 116, there is disposed an insulating film 122. In the region located directly above each of the plugs 117, there is disposed a plug 123 penetrating the insulating film 122. The plugs 123 are connected to the respective plugs 117.

On the insulating film 122, there is disposed an insulating film 124, and on the insulating film 124, there is disposed an insulating film 125.

In the region located directly above each of the plugs 123 in the insulating film 124 and the insulating film 125, there is disposed a bit line 126 extending in the X-direction.

Then, a configuration of the peripheral transistor area 100*b* will be explained.

In the peripheral transistor area 100*b*, a part of the surface of the semiconductor substrate 101 is provided with the impurity layers 101*a*, 101*b*. The impurity layers 101*a*, 101*b* are disposed continuously from the memory cell area 100*a*. The impurity layer 101*a* covers the lower surface of the impurity layer 101*b* and a side surface of the impurity layer 101*b* located on the peripheral transistor area 100*b* side.

Between the upper part of the impurity layer 101*a* and the upper part of the impurity layer 101*b*, there is disposed a device isolation film 127*a*. Further, between the upper part of the impurity layer 101*a* and the upper part of the semiconductor substrate 101, there is disposed a device isolation film 127*b*. Further, in a part of the upper part of the semiconductor substrate 101, there is disposed a device isolation film 127*c*. The device isolation films 127*a*, 127*b*, and 127*c* are disposed so as to be spaced from each other.

On a part of the surface of the impurity layer 101*b* on the memory cell area 100*a* side viewed from the device isolation film 127*a*, there is disposed a diffusion layer 128*a* having a conductivity type of $p^+$-type. The diffusion layer 128*a* is disposed so as to have contact with a side surface of the device isolation film 127*a*. Further, between the device isolation film 127*a* and the device isolation film 127*b*, there is disposed a diffusion layer 129 having a conductivity type of $n^+$-type. Further, between the device isolation film 127*b* and the device isolation film 127*c*, there is disposed a diffusion layer 128*b* having a conductivity type of $p^+$-type.

On each of the device isolation films 127*a*, 127*b*, and 127*c*, there is disposed a conductive film 130, and on the conductive film 130, there is disposed an insulating film 131. Further, there is disposed an insulating film 132 covering side surfaces of the conductive film 130 and the insulating film 131. The insulating film 132 also covers side surfaces of the upper part of each of the device isolation films 127*a*, 127*b*, and 127*c*. Further, in the region located directly above the area between the diffusion layer 128*a* located on the memory cell area 100*a* and the memory cell area 100*a*, there is disposed an insulating film 150. On the insulating film 150, there are disposed conductive films 151, 130 and the insulating film 131 in this order from the lower layer. Further, there is disposed an insulating film 152 covering side surfaces of the conductive films 151, 130, and the insulating film 131, the side surfaces being located on the peripheral transistor area 100*b* side.

Further, there is disposed an insulating film 133 covering an upper surface of the semiconductor substrate 101, a side surface of the insulating film 132, an upper surface of the insulating film 131, and upper surfaces of the diffusion layers 128*a*, 128*b*, and 129. On the insulating film 133, there is disposed an insulating film 134. On this occasion, in parts in which the insulating film 133 has contact with the upper surface of the semiconductor substrate 101, or the upper surface of one of the diffusion layers 128*a*, 128*b*, and 129, the insulating films 133, 134 each have a valley shape. Further, an insulating film 135 is disposed so as to fill the valley shape parts on the insulating film 134. It should be noted that the device isolation films 127*a*, 127*b*, and 127*c*, the diffusion layers 128*a*, 128*b*, and 129, the insulating film 150, the conductive films 151, 130, and the insulating films 131, 132, 133, and 134 form the peripheral transistor area.

On the insulating film 134 and the insulating film 135, there is disposed an insulating film 109. Further, the insulating film 109 also covers side surfaces of the conductive films 151, 130, and the insulating films 131, 133, and 134 on the insulating film 150, the side surfaces being located on the memory cell area 100a side. Further, the insulating film 109 also covers an upper surface of the interlayer insulating film 102 in the peripheral transistor area 100b.

On the insulating film 109, the insulating films 110, 114 are disposed continuously from the memory cell area 100a.

In the region directly above each of the diffusion layers 128a, 128b, there is formed a contact hole 138a penetrating the insulating films 114, 110, 109, 134, and 133. In each of the contact holes 138a, there is disposed a contact 138.

In the region directly above the diffusion layer 129, there is formed a contact hole 139a penetrating the insulating films 114, 110, 109, 134, and 133. In the contact hole 139a, there is disposed a contact 139.

On the insulating film 114, the insulating film 116 is disposed continuously from the memory cell area 100a. In the region located directly above each of the contacts 138 in the lower part of the insulating film 116, there is disposed a plug 140. Further, in the region located directly above the contact 139 in the lower part of the insulating film 116, there is disposed a plug 141.

In the region located directly above each of the plugs 140 in the upper part of the insulating film 116, there is disposed an interconnection 142 extending in the X-direction. Further, in the region located directly above the plugs 141 in the upper part of the insulating film 116, there is disposed an interconnection 143 extending in the X-direction.

On the insulating film 116, the insulating film 122 is disposed continuously from the memory cell area 100a.

In the region located directly above each of the interconnections 142 in the insulating film 122, there is disposed a plug 144. On the insulating film 122, there is disposed an interconnection 145 extending in the Y-direction.

Then, a shape of the memory hole of the integrated circuit device according to the embodiment will be explained.

As shown in FIG. 2A, the shape of the memory hole 105 is a roughly cylindrical shape penetrating the stacked body ML and the interlayer insulating film 102 in the Z-direction.

Further, as shown in FIG. 2B, the cross-sectional shape in the upper part of the memory hole 105 viewed from the Z-direction is a roughly circular shape. The aspect ratio of the memory hole 105 is, for example, not less than 50.

Then, a shape of the slit of the integrated circuit device according to the embodiment will be explained.

Figure 3:
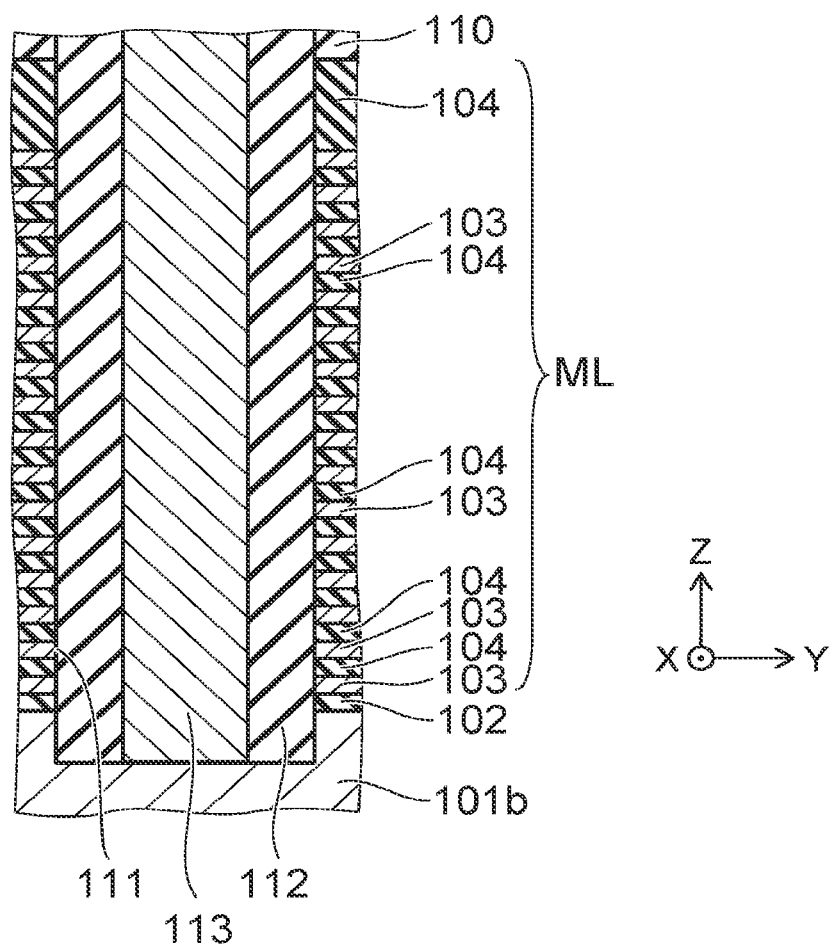
FIG. 3 is an enlarged cross-sectional view of the area B shown in FIG. 1 of the integrated circuit device according to the first embodiment.

FIG. 3 is an enlarged cross-sectional view of the area B shown in FIG. 1 of the integrated circuit device according to the embodiment.

As shown in FIG. 3, when viewed from the X-direction, the slit 111 linearly divides the insulating film 110, the stacked body ML, and the interlayer insulating film 102, which are located in an area directly below the insulating film 110, in the Y-direction.

Then, a shape of the contact hole of the integrated circuit device according to the embodiment will be explained.

FIG. 4A is an enlarged cross-sectional view of an area C shown in FIG. 1 of the integrated circuit device according to the embodiment, FIG. 4B is a cross-sectional view in the F-F' line shown in FIG. 4A, and FIG. 4C is a cross-sectional view in the G-G' line shown in FIG. 4A.

As shown in FIG. 4A, when viewed from the X-direction, the shape of the contact hole 138a is a roughly tapered shape.

Further, as shown in FIG. 4B, the cross-sectional shape in the upper part of the contact hole 138a viewed from the Z-direction is a roughly circular shape.

Further, as shown in FIG. 4C, the cross-sectional shape in the lower part of the contact hole 138a viewed from the Z-direction is also a roughly circular shape. The diameter in the lower part of the contact hole 138a is smaller than the diameter in the upper part of the contact hole 138a.

It should be noted that although the explanation is presented citing the contact hole 138a as an example, the same applied to the contact hole 139a.

Then, a method for manufacturing the integrated circuit device according to the embodiment will be explained.

FIG. 5A through FIG. 16C are process cross-sectional views illustrating the method for manufacturing the integrated circuit device according to the embodiment.

FIG. 5A through FIG. 10C are process cross-sectional views illustrating a process for forming the pillar part of the integrated circuit device.

FIG. 5A through FIG. 7A, FIG. 8A, FIG. 9A, and FIG. 10A are each a cross-sectional view showing an area corresponding to the area A shown in FIG. 1.

Figure 7A:
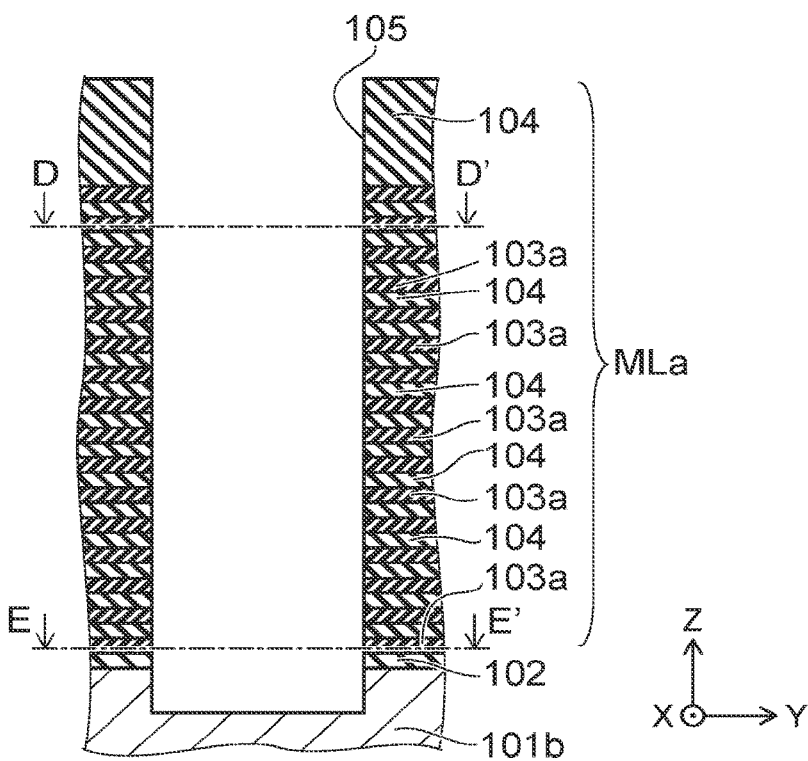
Figures 7B, 7C:
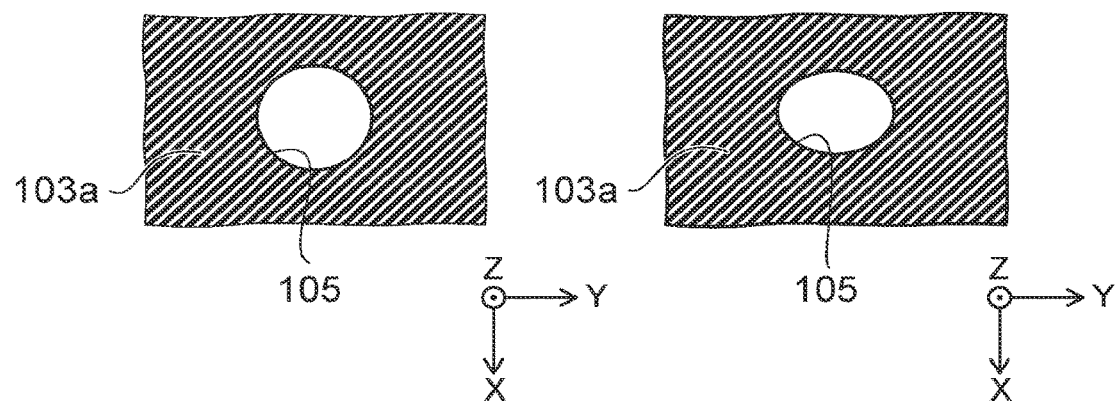

FIG. 7B is a cross-sectional view in the D-D' line shown in FIG. 7A, and FIG. 7C is a cross-sectional view in the E-E' line shown in FIG. 7A.

Figure 8A:
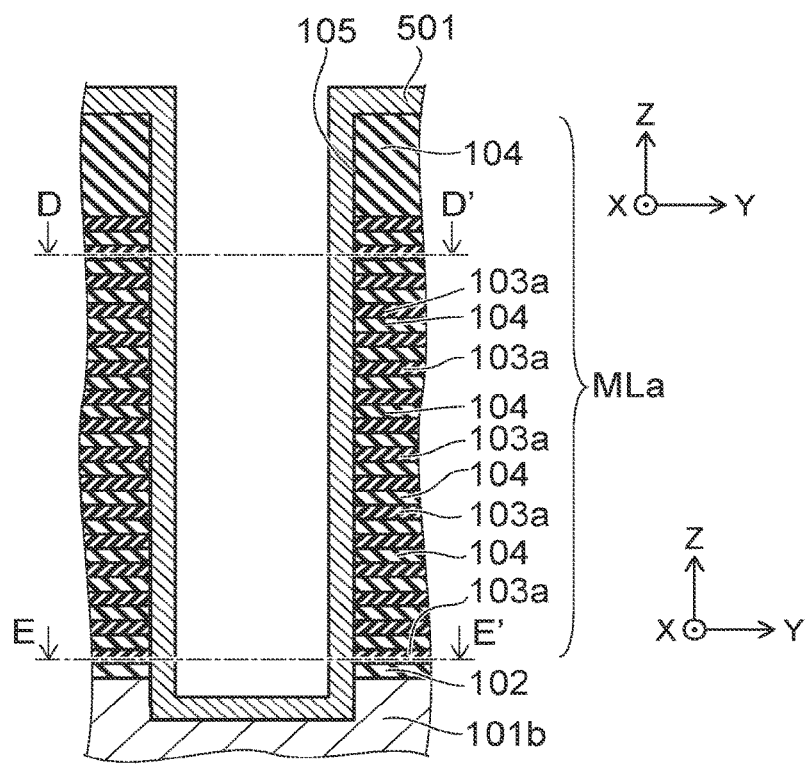
Figures 8B, 8C:
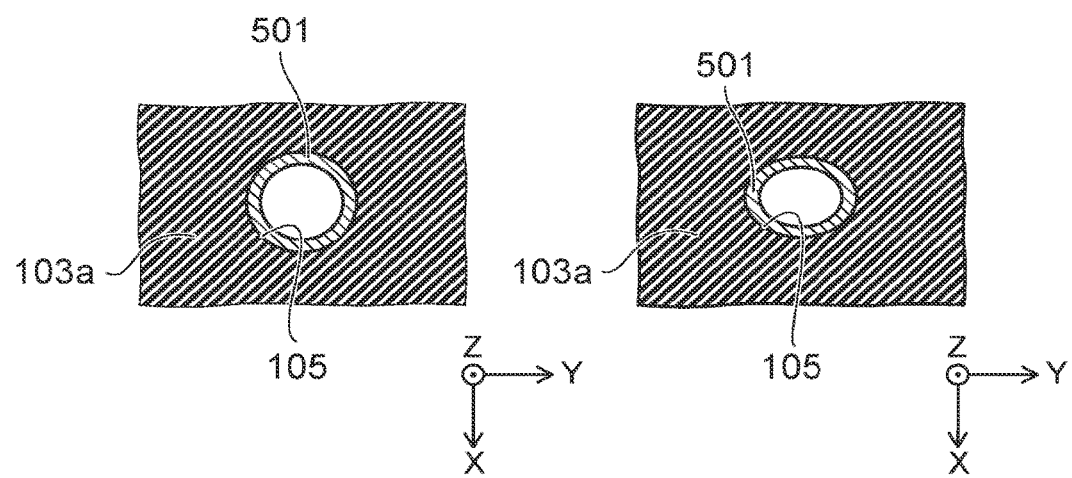

FIG. 8B is a cross-sectional view in the D-D' line shown in FIG. 8A, and FIG. 8C is a cross-sectional view in the E-E' line shown in FIG. 8A.

Figure 9A:
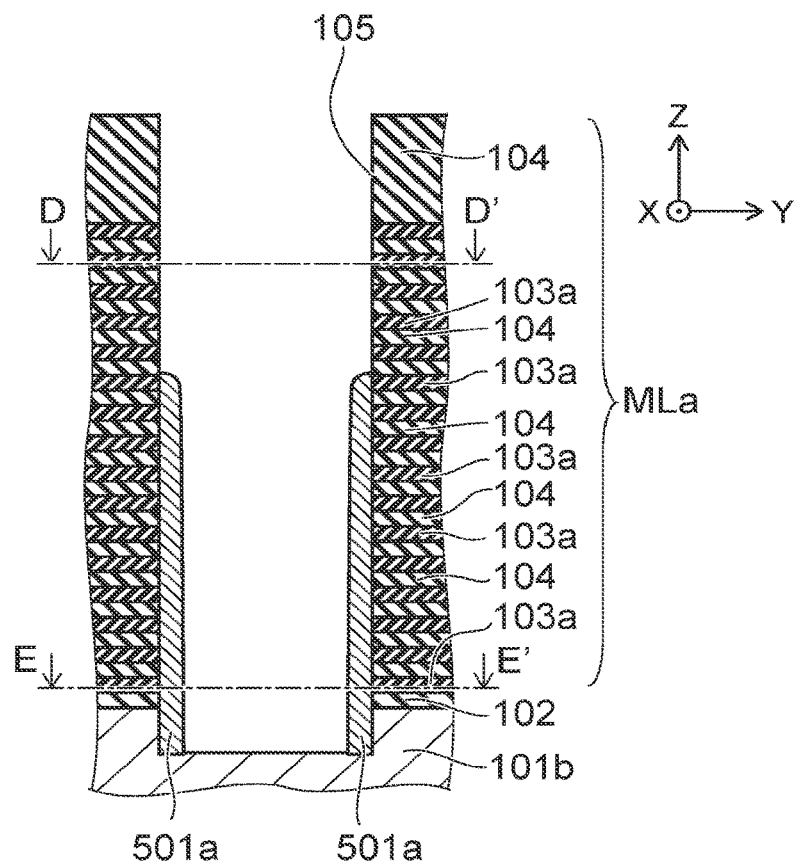
Figures 9B, 9C:
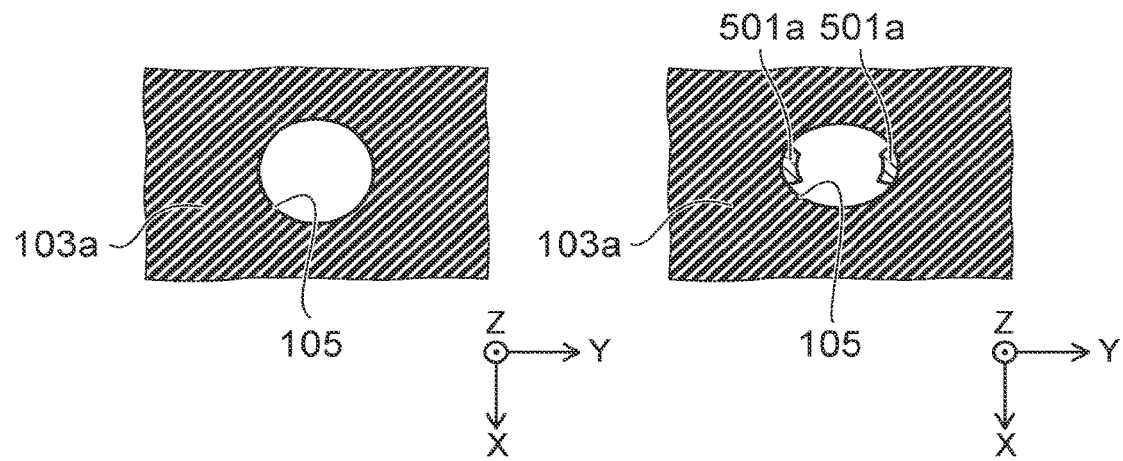

FIG. 9B is a cross-sectional view in the D-D' line shown in FIG. 9A, and FIG. 9C is a cross-sectional view in the E-E' line shown in FIG. 9A.

FIG. 10B is a cross-sectional view in the D-D' line shown in FIG. 10A, and FIG. 10C is a cross-sectional view in the E-E' line shown in FIG. 10A.

Firstly, as shown in FIG. 1, an impurity to be a donor is injected in an upper part of the semiconductor substrate 101 using an ion injection process to thereby form the impurity layer 101a on the semiconductor substrate 101 having a conductivity type of p⁻-type. An impurity to be an acceptor is injected in an upper part of the impurity layer 101a using an ion injection process to thereby form the impurity layer 101b.

Figure 5A:
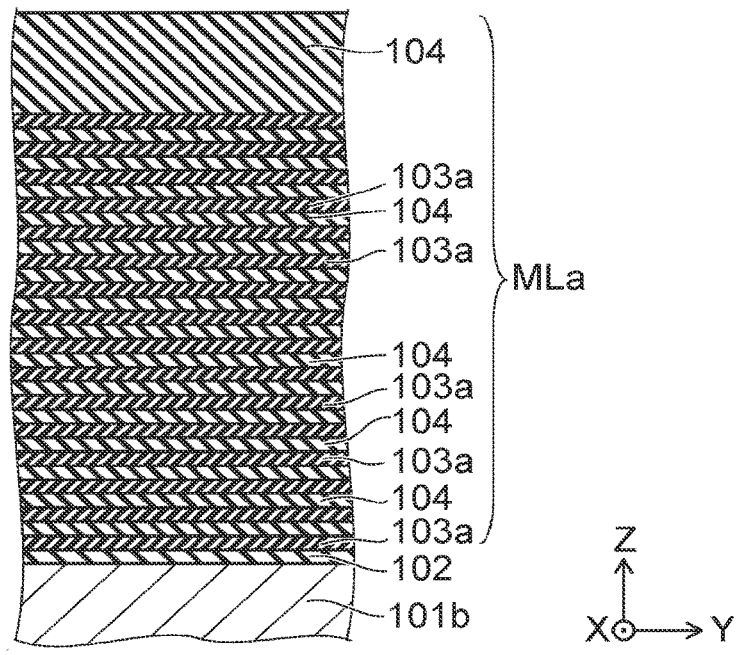

Subsequently, as shown in FIG. 5A, the interlayer insulating film 102 is formed on the impurity layer 101b. On the interlayer insulating film 102, sacrifice films 103a and the inter-electrode insulating films 104 are alternately stacked to thereby form the stacked body MLa. On this occasion, the sacrifice films 103a are each formed of a silicon nitride film, and the inter-electrode insulating films 104 are each formed of a silicon oxide film.

Figure 5B:
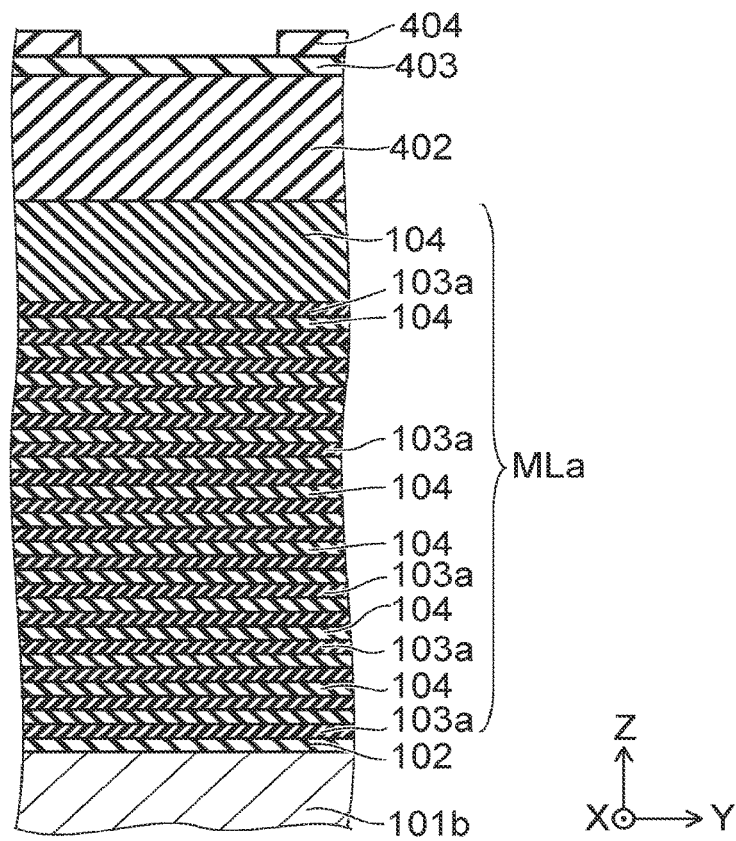

Subsequently, as shown in FIG. 5B, a mask member 402 is formed on the stacked body MLa. On the mask member 402, a mask member 403 is formed. The mask member 401 is formed of a mask material including carbon. Further, the mask member 403 is formed of a mask material including an inorganic substance. The mask member 403 can be formed using, for example, a silicon oxide film.

Subsequently, a resist is applied on the mask member 403 to thereby form a resist film. Then, a photolithography process is performed on the resist film to form a hole pattern to thereby form a resist pattern 404.

Figure 6A:
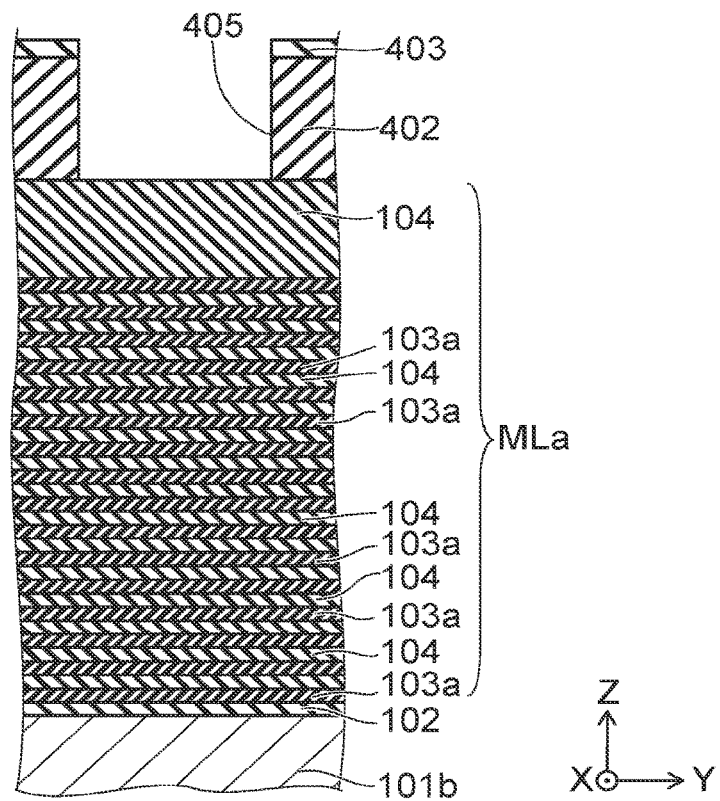

Subsequently, as shown in FIG. 6A, by etching the mask member 403 using the resist pattern 404 as an etch mask, an opening section is formed in the mask member 403. Then, the mask member 402 is processed by an anisotropic etching process such as a reactive ion etching (RIE) process using the mask member 403 as an etch mask. Thus, an opening section 405 penetrating the mask members 402, 403 is formed.

Figure 6B:
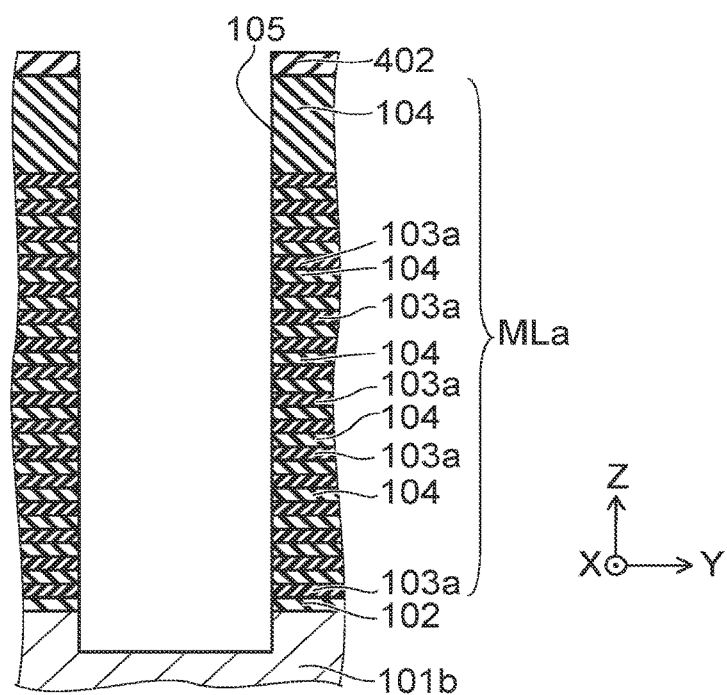

Subsequently, as shown in FIG. 6B, by performing an anisotropic etching process such as the RIE process using the mask members 402, 403 as etch masks, the memory holes 105 penetrating the stacked body MLa and the interlayer insulating film 102 are formed.

Subsequently, as shown in FIG. 7A, the mask member 402 remaining on the stacked body MLa is removed by ashing.

On this occasion, as shown in FIG. 7B, the shape of the memory hole 105 viewed from the Z-direction is a roughly circular shape in the upper part of the memory hole 105. In contrast, in the lower part of the memory hole 105, the shape is lower in circularity compared to the shape in the upper part of the memory hole 105 as shown in FIG. 7C. The shape in the lower part of the memory hole 105 is, for example, a distorted elliptical shape.

Subsequently, as shown in FIG. 8A, a sacrifice film 501 is formed on the inner side surface of the memory hole 105. The sacrifice film 501 is formed using a material including polysilicon. Further, the sacrifice film 501 can also be formed using a material including a silicon oxide, a material including a silicon nitride, a material including germanium, or a material including tungsten.

As shown in FIG. 8B and FIG. 8C, the sacrifice film 501 is formed on the inner side surface of the memory hole 105 with a roughly even thickness.

Subsequently, as shown in FIG. 9A, a part of the sacrifice film 501 is removed using an isotropic etching process such as a chemical dry etching process. The etching condition on this occasion is set to the condition in which a part of the sacrifice film 501 larger in curvature radius is higher in etching rate than a part smaller in curvature radius. Due to the etching process, a residual film of the sacrifice film 501 and a reaction product generated in the etching process remain on a part small in curvature radius in the inner side surface of the memory hole 105.

In other words, as shown in FIG. 9B, in the upper part of the memory hole 105, since the circularity of the memory hole 105 is high, the sacrifice film 501 is roughly evenly removed from the surface. Therefore, the residual film of the sacrifice film 501 and the reaction product hardly remain. In contrast, as shown in FIG. 9C, in the lower part of the memory hole 105, since the circularity is lower compared to the upper part, and the distorted elliptical shape appears, the residual film of the sacrifice film 501 and the reaction product generated in the etching process remain in the part small in curvature radius. The residual film of the sacrifice film 501 and the reaction product generated in the etching process form a sacrifice film 501a.

Subsequently, as shown in FIG. 10A, an isotropic etching process such as a chemical dry etching process is performed on the inner side surface of the memory hole 105. The etching condition on this occasion is set to the condition in which the difference in etching rate between the sacrifice film 501a and the stacked body MLa inside the memory hole 105 is small. It should be noted that it is also possible to etch the sacrifice film 501a and the stacked body MLa without changing the etching condition from the process shown in FIG. 9A. Further, it is also possible to perform the etching process on the sacrifice film 103a, the inter-electrode insulating film 104, and the interlayer insulating film 102 in the condition of the high etching rate, and then perform the etching process on the sacrifice film 501a in the condition of the high etching rate. In this case, it is possible to perform some of the etching processes using the RIE method or the wet etching method. In the case in which the inter-electrode insulating film 104 and the interlayer insulating film 102 include the same material, it is possible to etch both of the inter-electrode insulating film 104 and the interlayer insulating film 102 in the same etching condition.

Using the etching process described above, while removing the sacrifice film 501a, the area large in curvature radius in the stacked body MLa is made to recede. In the lower part of the memory hole 105, the part small in curvature radius is masked with the sacrifice film 501a, and is therefore difficult to be affected by the etching process. In contrast, the part large in curvature radius in the lower part of the memory hole 105 is exposed from the sacrifice film 501a, and is therefore selectively processed by the etching process. Thus, the circularity of the lower part of the memory hole 105 is improved. Further, as shown in FIG. 10B and FIG. 10C, the difference in circularity between the upper part and the lower part of the memory hole 105 decreases compared to the difference in circularity between the upper part and the lower part of the memory hole 105 shown in FIG. 7B and FIG. 7C.

Subsequently, the memory film 301 and the pillar 401 are formed inside the memory hole 105 using a public-known method.

Using the process explained hereinabove, the pillar 401 of the integrated circuit device 100 according to the embodiment is formed.

Then, a method for manufacturing the source line part of the integrated circuit device according to the embodiment will be explained.

FIG. 11A through FIG. 11D are process cross-sectional views illustrating a method for manufacturing the integrated circuit device according to the embodiment, and each show an area corresponding to the area B shown in FIG. 1.

Figure 11A:
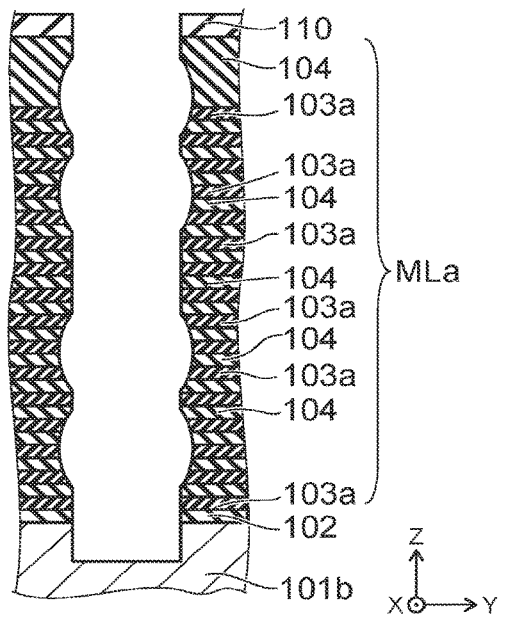

As shown in FIG. 11A, the insulating film 110 is formed on the stacked body MLa. Using the anisotropic etching process such as the RIE process, the slit 111, which penetrates the insulating film 110, the stacked body MLa, and the interlayer insulating film 102, and then reaches the impurity layer 101b, is formed. The shape of the slit 111 is a belt-like shape extending in the X-direction. On this occasion, the side surface of the slit 111 has an uneven shape.

Figure 11B:
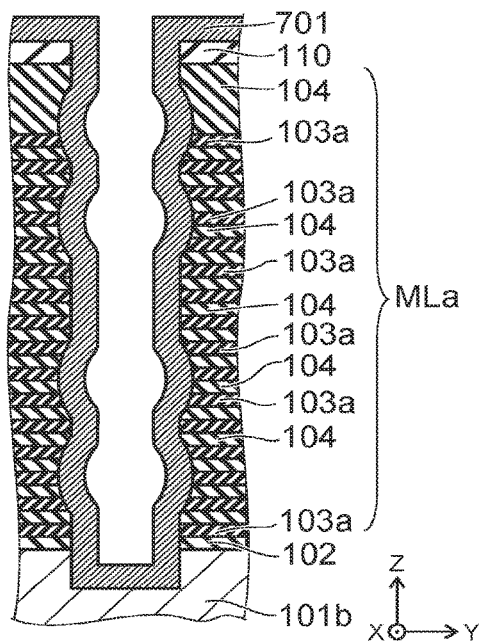

Subsequently, as shown in FIG. 11B, a sacrifice film 701 is formed on the inner side surface of the slit 111. On this occasion, the sacrifice film 701 is formed using a material including polysilicon. Further, the sacrifice film 701 can also be formed using a material including a silicon oxide, a material including a silicon nitride, a material including germanium, or a material including tungsten. The sacrifice film 701 is formed along the shape of the side surface of the slit 111 with a roughly even thickness. Thus, the side surface of the sacrifice film 701 inside the slit 111 has an uneven shape.

Figure 11C:
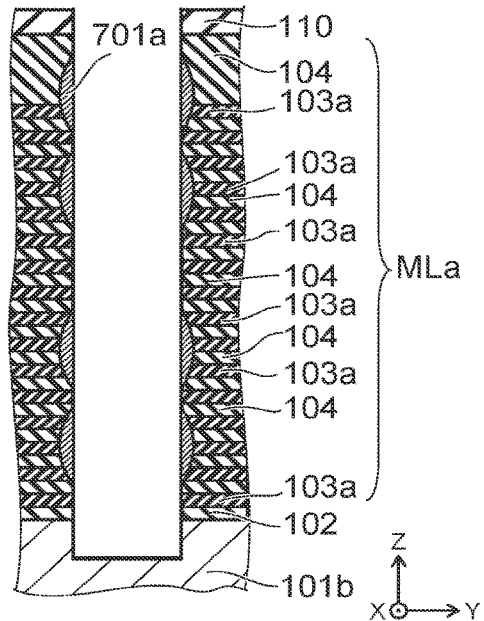

Subsequently, as shown in FIG. 11C, a part of the sacrifice film 701 is removed using an isotropic etching process such as a chemical dry etching process. The etching condition on this occasion is set to the condition in which a part of the sacrifice film 701 larger in curvature radius is higher in etching rate than a part smaller in curvature radius. Due to the etching process, a residual film of the sacrifice film 701 and a reaction product generated in the etching process remain on a part small in curvature radius in the side surface of the slit 111. Thus, on the part small in curvature radius in the side surface of the slit 111, there is formed a sacrifice film 701a.

Figure 11D:
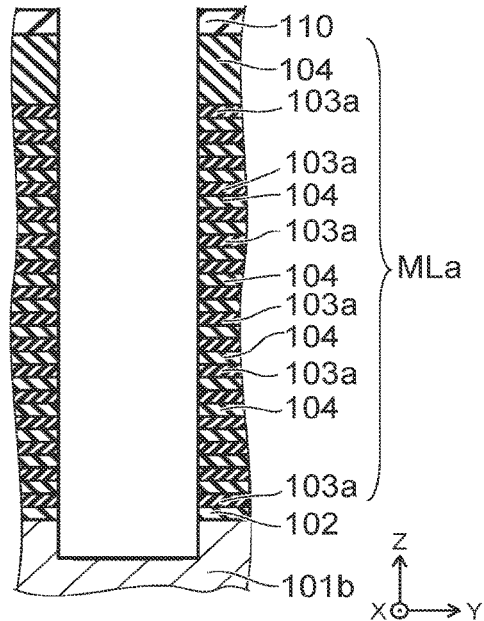

Subsequently, as shown in FIG. 11D, an isotropic etching process such as a chemical dry etching process is performed on the inner side surface of the slit 111. The etching condition on this occasion is set to the condition in which the difference in etching rate between the sacrifice film 701a, and the stacked body MLa and the insulating film 110 inside the slit 111 is small. It should be noted that it is also possible to etch the sacrifice film 701a, the insulating film 110, and the stacked body MLa without changing the etching condition from the process shown in FIG. 11C. Further, it is also possible to perform the etching process on the sacrifice film 103a, the insulating film 110, the inter-electrode insulating film 104, and the interlayer insulating film 102 in the condition of the high etching rate, and then perform the etching process on the sacrifice film 701a in the condition of the high etching rate. In this case, it is possible to perform some of the etching processes using the RIE method or the wet etching method. In the case in which the insulating film 110, the inter-electrode insulating film 104, and the interlayer insulating film 102 include the same material, it is possible to etch all of the insulating film 110, the inter-electrode insulating film 104, and the interlayer insulating film 102 in the same etching condition.

By the etching process, while removing the sacrifice film 701a, the area large in curvature radius in the side surface of the slit 111 is made to recede. Thus, the roughness in the side surface of the slit 111 is reduced.

Subsequently, as shown in FIG. 3, by performing the wet etching process via the slit 111, the sacrifice films 103a are selectively removed to provide recessed sections to the stacked body MLa. Subsequently, the electrode films 103 are formed in the respective recessed sections via the slit 111. Then, the insulating members 112 are formed on the respective inner side surfaces of the slit 111. Then, the slit 111 is filled with a conductive member to thereby form the source line 113.

Then, a method for manufacturing the contact part of the integrated circuit device according to the embodiment will be explained.

FIG. 12, FIG. 13A, FIG. 14A, FIG. 15A, and FIG. 16A are each an enlarged cross-sectional view showing an area corresponding to the area B shown in FIG. 1.

Figure 13A:
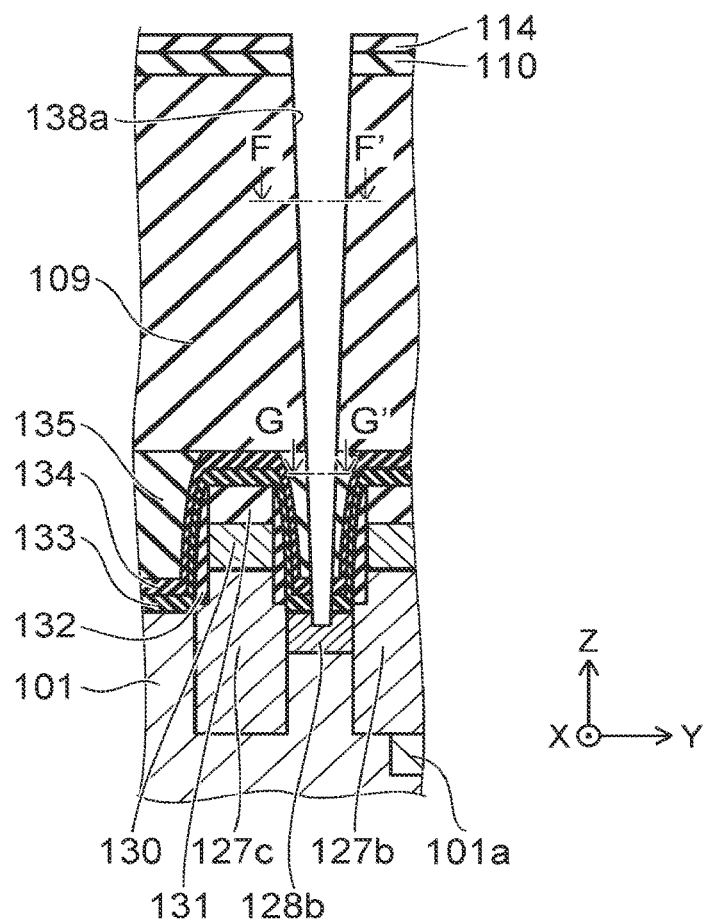
Figures 13B, 13C:
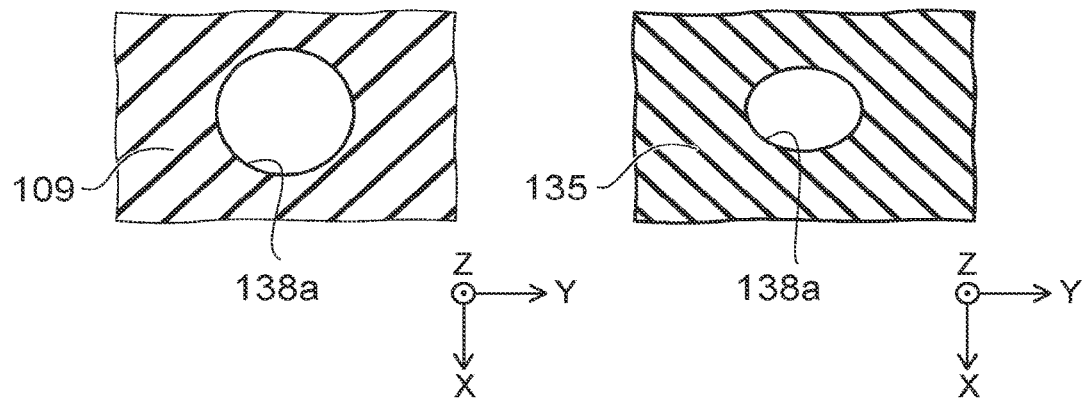

FIG. 13B is a cross-sectional view in the F-F' line shown in FIG. 13A, and FIG. 13C is a cross-sectional view in the G-G' line shown in FIG. 13A.

Figure 14A:
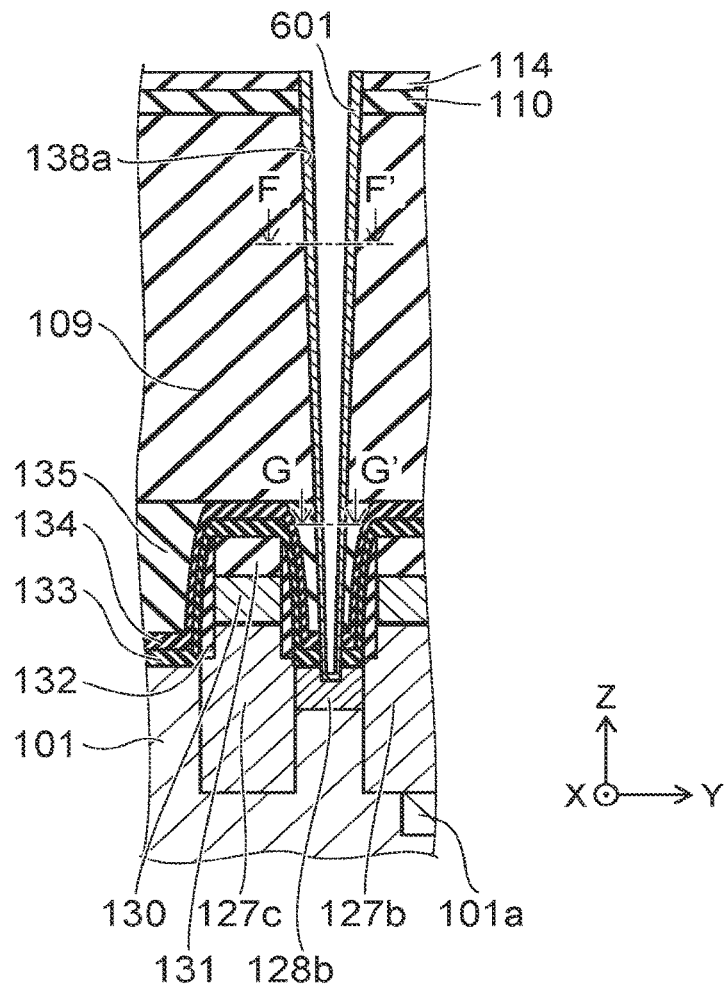
Figure 14B:
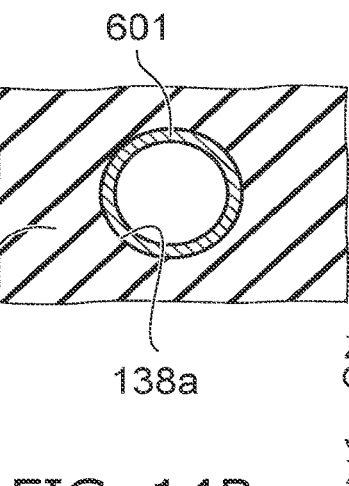
Figure 14C:
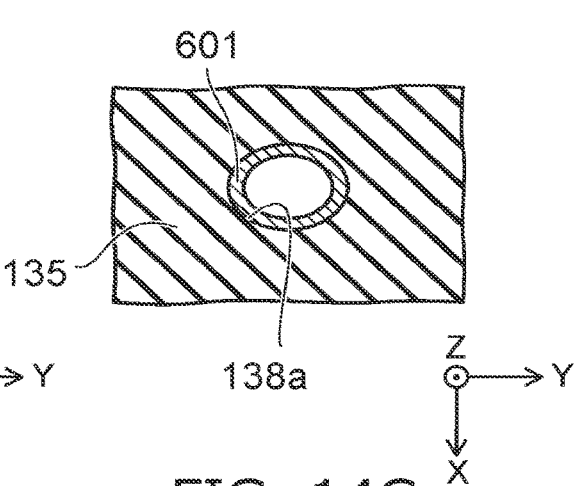

FIG. 14B is a cross-sectional view in the F-F' line shown in FIG. 14A, and FIG. 14C is a cross-sectional view in the G-G' line shown in FIG. 14A.

Figures 15A, 15B, 15C:
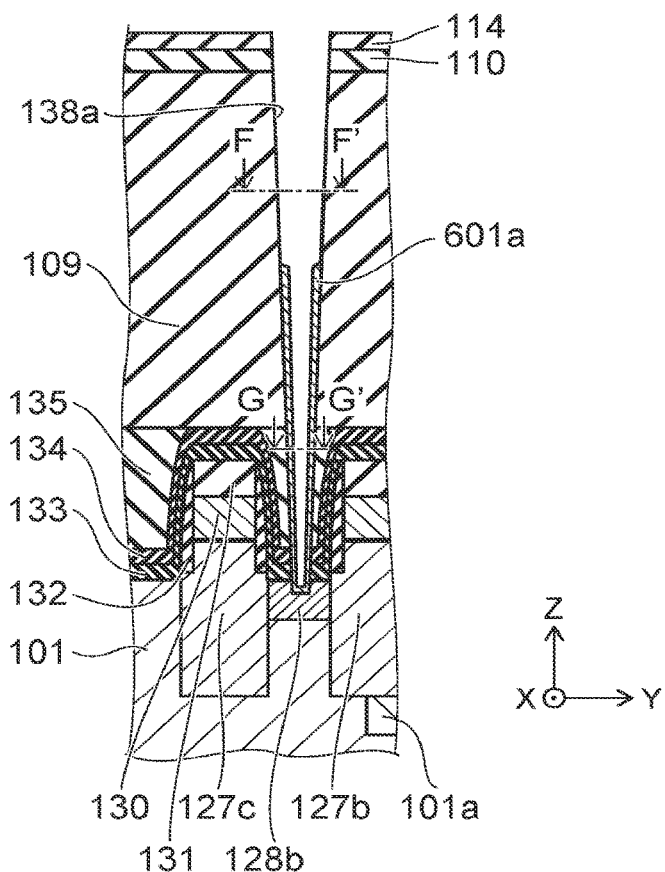

FIG. 15B is a cross-sectional view in the F-F' line shown in FIG. 15A, and FIG. 15C is a cross-sectional view in the G-G' line shown in FIG. 15A.

Figure 16A:
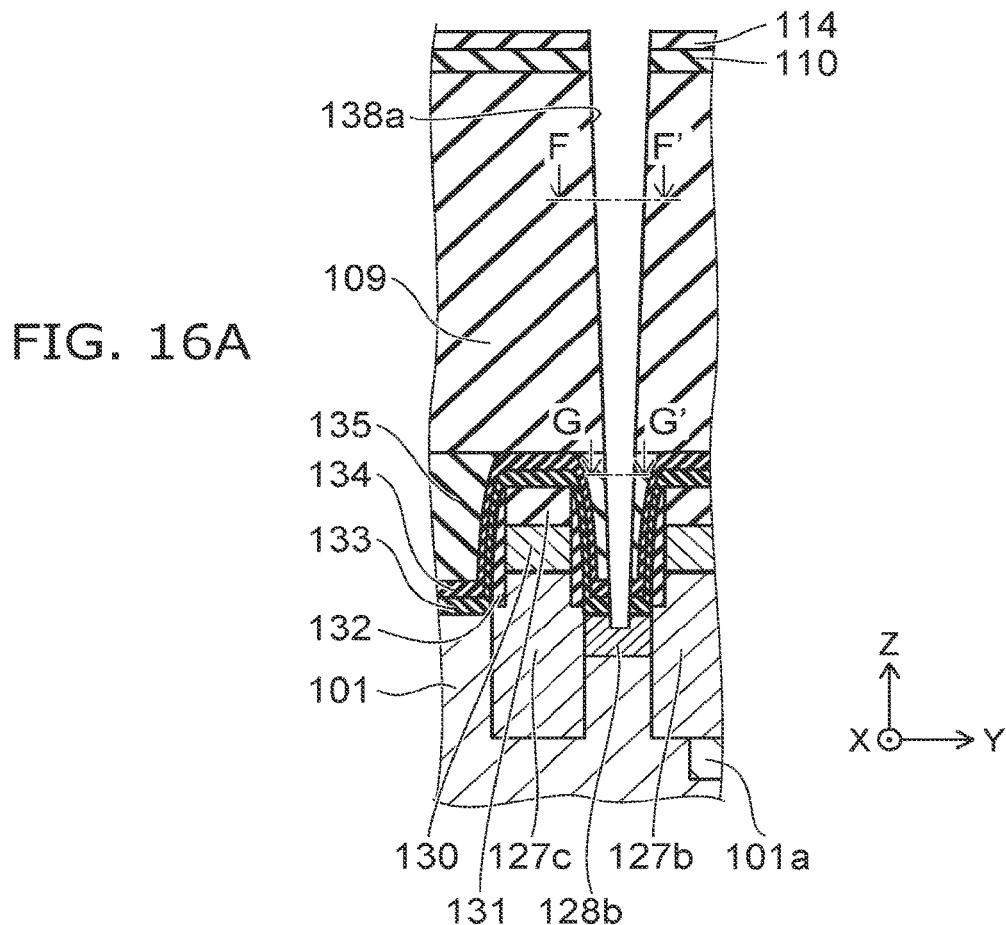
Figure 16B:
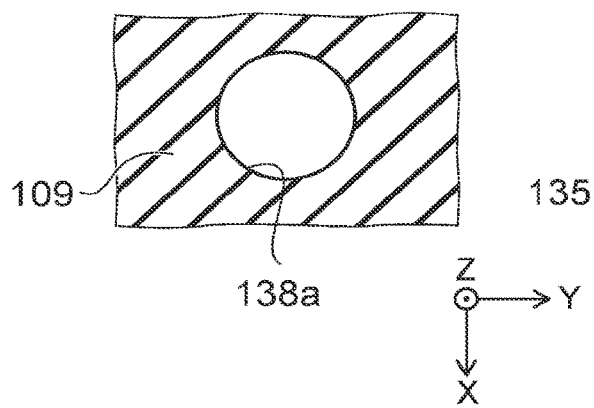
Figure 16C:
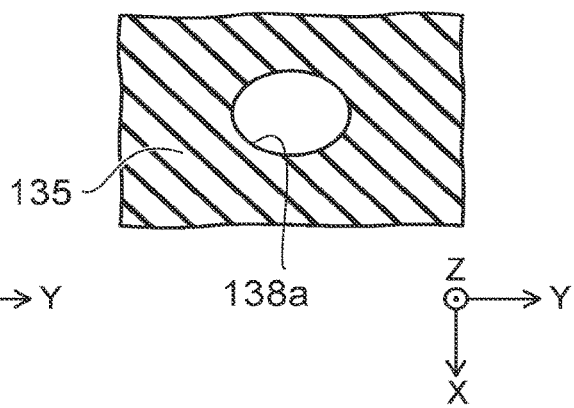

FIG. 16B is a cross-sectional view in the F-F' line shown in FIG. 16A, and FIG. 16C is a cross-sectional view in the G-G' line shown in FIG. 16A.

Figure 12:
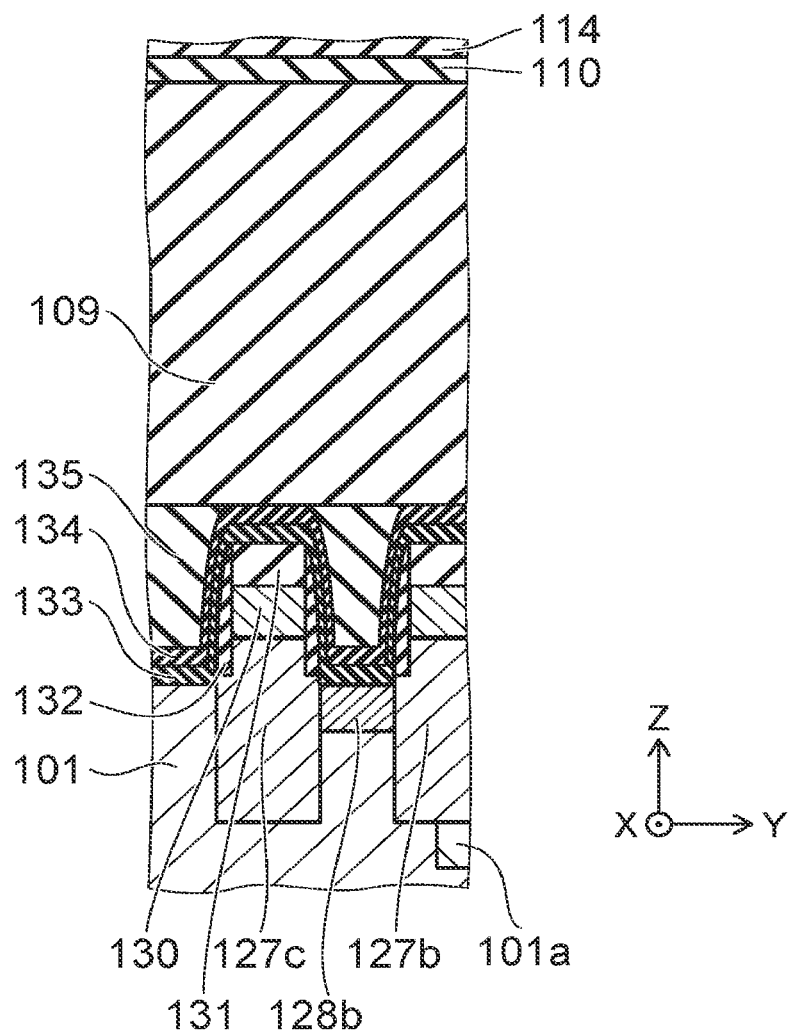

As shown in FIG. 12, in the peripheral transistor area 100b, the peripheral transistors are formed on the semiconductor substrate 101 using a public-known method. Then, the peripheral transistors are covered with the insulating film 135.

Subsequently, the insulating film 109 is formed on the insulating films 134, 135. On the insulating film 109, the insulating film 110 is formed. Subsequently, on the insulating film 110, the insulating film 114 is formed.

Then, as shown in FIG. 13A, in the region located directly above the diffusion layer 128a, the contact hole 138a penetrating the insulating films 114, 110, 109, 134, and 133 is formed using an anisotropic etching process such as an RIE process.

On this occasion, as shown in FIG. 13B, the shape of an upper part of the contact hole 138a viewed from the Z-direction is a roughly circular shape. In contrast, as shown in FIG. 13C, the shape of the lower part of the contact hole 138a is a shape lower in circularity than the shape of the upper part. For example, the lower part of the contact hole 138a is processed so as to have a distorted elliptical shape.

Subsequently, as shown in FIG. 14A through FIG. 14C, a sacrifice film 601 is formed on the inner side surface of the contact hole 138a with a roughly even thickness. The sacrifice film 601 is formed using a material including polysilicon. Further, the sacrifice film 601 can also be formed using a material including a silicon oxide, a material including a silicon nitride, a material including germanium, or a material including tungsten.

Subsequently, as shown in FIG. 15A, a part of the sacrifice film 601 is removed using an isotropic etching process such as a chemical dry etching process. The etching condition on this occasion is set to the condition in which a part of the sacrifice film 601 larger in curvature radius is higher in etching rate than a part smaller in curvature radius. Due to the etching process, a residual film of the sacrifice film 601 and a reaction product generated in the etching process remain on a part small in curvature radius in the side surface of the contact hole 138a. Thus, as shown in FIG. 15B and FIG. 15C, on a part of the inner side surface small in curvature radius of the contact hole 138a, a sacrifice film 601a including the residual film of the sacrifice film 601 and the reaction product generated in the etching process is selectively formed.

Subsequently, as shown in FIG. 16A, an isotropic etching process such as a chemical dry etching process is performed on the inner side surface of the contact hole 138a. The etching condition on this occasion is set to the condition in which the difference in etching rate between the sacrifice film 601a, and the insulating films 109, 135, 133, and 132 inside the contact hole 138a is small. It should be noted that it is also possible to etch the sacrifice film 601a, the insulating films 109, 135, 133, and 132 without changing the etching condition from the process shown in FIG. 14A.

By the etching process, while removing the sacrifice film 601a, the part large in curvature radius in the inner side surface of the contact hole 138a is processed. Thus, the circularity of the lower part of the contact hole 138a is improved. Further, as shown in FIG. 16B and FIG. 16C, the difference in circularity between the upper part and the lower part of the contact hole 138a becomes lower than the difference in circularity between the upper part and the lower part of the contact hole 138a shown in FIG. 13B and FIG. 13C.

Subsequently, as shown in FIG. 4A, the contact hole 138a is filled with a conductive material to thereby form the contact 138.

Using the manufacturing method explained hereinabove, the contacts are formed.

It should be noted that although the explanation is presented citing the contact 138 as an example, the same applied to the contact 139.

Subsequently, by performing a public-known process to form the members such as upper interconnections and the plugs, the integrated circuit device 100 according to the embodiment shown in FIG. 1 is manufactured.

Then, advantages of the embodiment will be explained.

In the case in which the circularity of the memory hole is low, the shapes of the memory film and the pillar formed in the memory hole also become distorted shapes low in circularity. In this case, it leads to the failure of the device in some cases in such a manner that the electric field is concentrated in the part small in curvature radius of the memory film and the pillar. Further, depending on the shape of the lower part of the memory hole, it is also possible that the lower part of the memory hole is blocked in the stage in which the memory film and the semiconductor film are formed in the memory hole. In this case, it becomes difficult to selectively remove the memory film and the semiconductor film formed on the bottom surface of the memory hole to form the connection section between the impurity layer and the pillar in the etching process for forming the connection section with the impurity layer, and there is a possibility of leading to the failure of the device.

In contrast, in the case of the embodiment, there is performed the processing for improving the circularity of the memory hole 105 is performed. Thus, the electric field concentration is inhibited in the memory film 301 and the pillar 401. Further, the trouble in forming the pillar 410 is also suppressed.

Further, since the processing for improving the circularity in the lower part of the contact hole 138a is also performed, the electric field concentration can also be suppressed in the contact 138.

Further, the processing for reducing the roughness on the inner side surface of the slit 111 is also performed. Thus, the unevenness is inhibited from being provided to the source line 113. Therefore, the electric field concentration in the source line 113 can be suppressed.

Second Embodiment

Then, a second embodiment is hereinafter explained.

The configuration of the integrated circuit device according to the embodiment is substantially the same as in the first embodiment.

Then, a method for manufacturing the pillar part of the integrated circuit device according to the embodiment will be explained.

FIG. 17 through FIG. 20C are process cross-sectional views each showing an area corresponding to the area A shown in FIG. 1.

Firstly, the process shown in FIG. 5A through FIG. 6A is performed similarly to the first embodiment.

Figure 17:
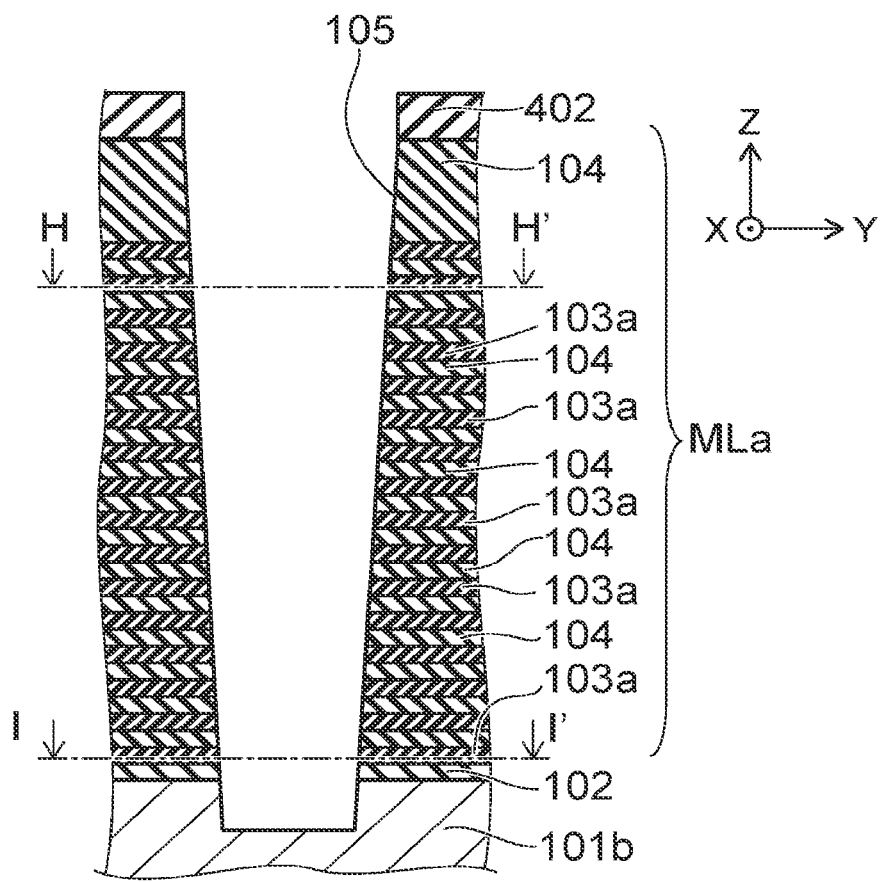
FIG. 17 through FIG. 20C are process cross-sectional views each showing an area corresponding to the area A shown in FIG. 1.

Subsequently, as shown in FIG. 17, the memory hole 105 is formed in the stacked body MLa using an anisotropic etching process such as an RIE process. On this occasion, the memory hole 105 is formed so as to have a large diameter in the upper part and a small diameter in the lower part. The memory hole 105 has a tapered shape viewed from the X-direction.

Figures 18A, 18B, 18C:
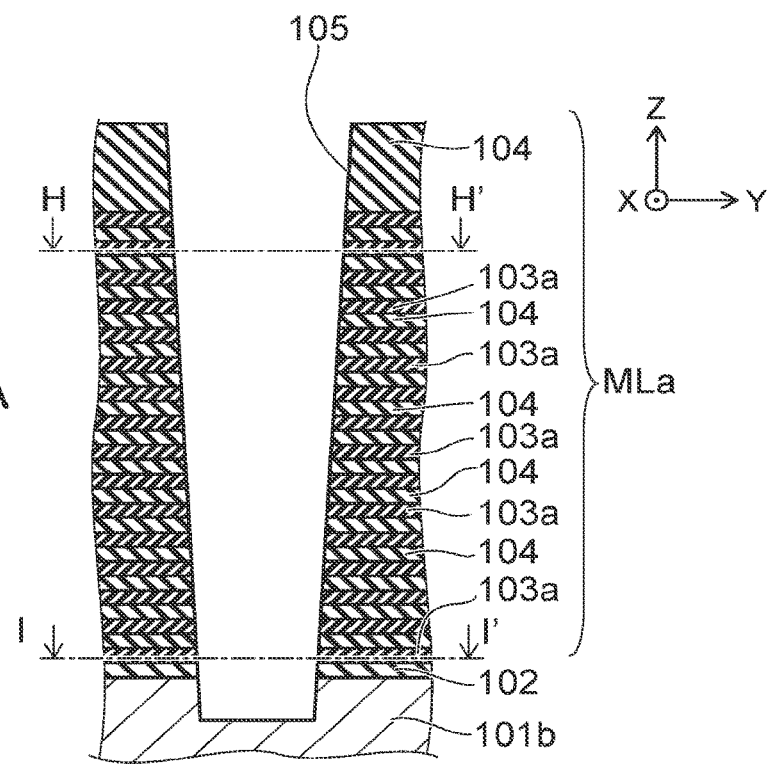

Subsequently, as shown in FIG. 18A, the mask member 402 remaining on the stacked body MLa is removed by ashing. On this occasion, as shown in FIG. 18B, the shape of the memory hole 105 viewed from the Z-direction is a roughly circular shape in the upper part of the memory hole 105. In contrast, as shown in FIG. 18C, the shape of the lower part of the memory hole 105 is smaller in diameter and lower in circularity compared to the shape in the upper part of the memory hole 105. The shape of the lower part of the memory hole 105 is, for example, a distorted elliptical shape.

Figure 19A:
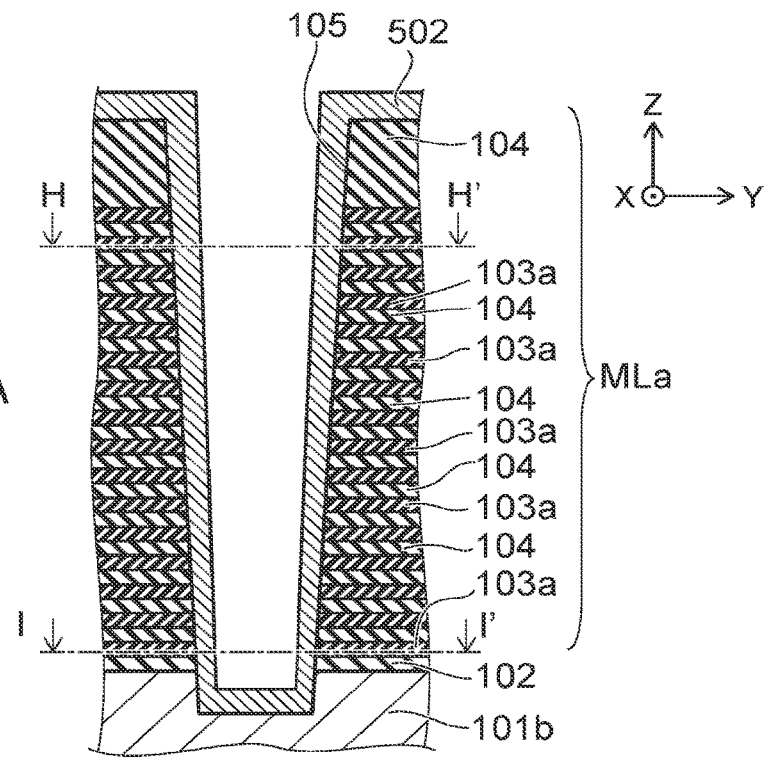
Figure 19B:
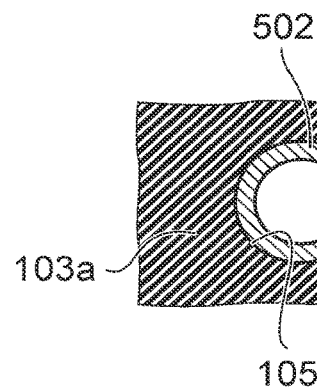
Figure 19C:
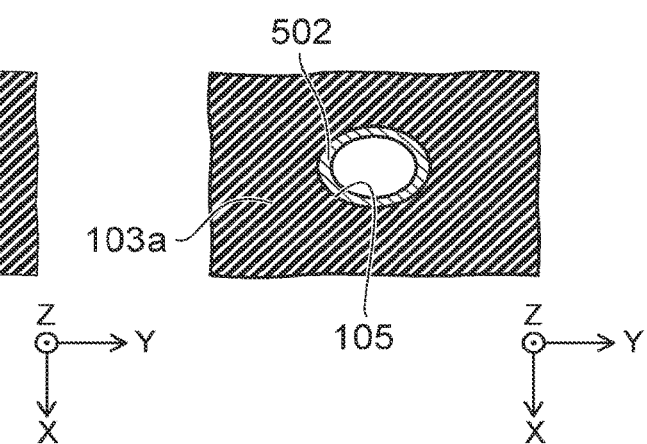

Subsequently, as shown in FIG. 19A through FIG. 19C, a sacrifice film 502 is formed on the inner side surface of the memory hole 105. On this occasion, the sacrifice film 502 is formed in a condition of low embeddability. In other words, the sacrifice film 502 is formed in the condition in which the sacrifice film 502 is easily formed in the upper part of the memory hole 105, and the lower the part is, the more difficult the sacrifice film 502 is to be formed in the part. Thus, the sacrifice film 502 is formed on the inner side surface of the memory hole 105 in such a manner that the higher the part of the memory hole 105 is, the thicker the sacrifice film 502 on the part is, and the lower the part is, the thinner the sacrifice film 502 on the part is.

The sacrifice film 502 is formed using a material including polysilicon. Further, the sacrifice film 502 can also be formed using a material including a silicon oxide, a material including a silicon nitride, a material including germanium, or a material including tungsten.

Figure 20A:
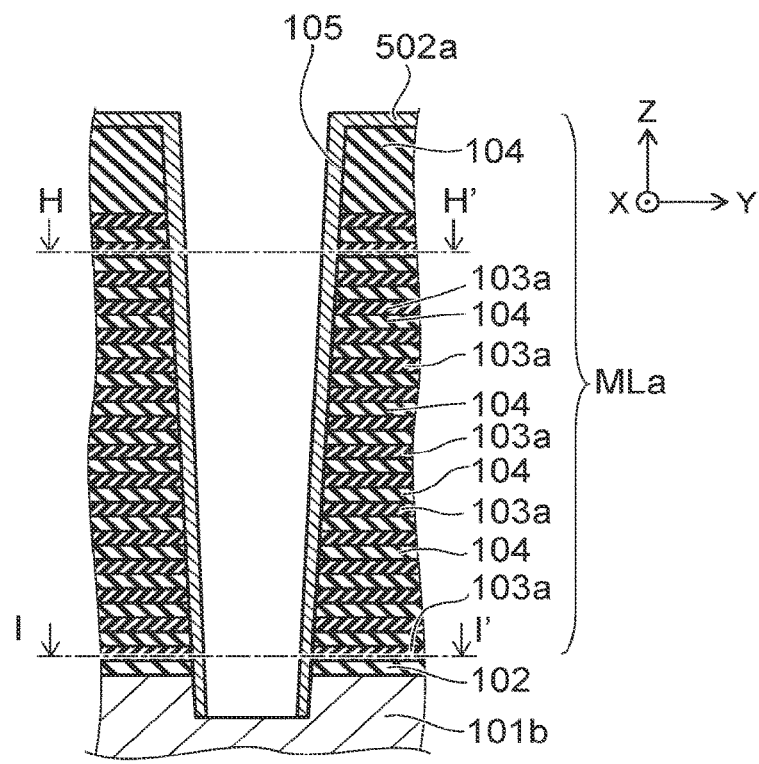
Figure 20B:
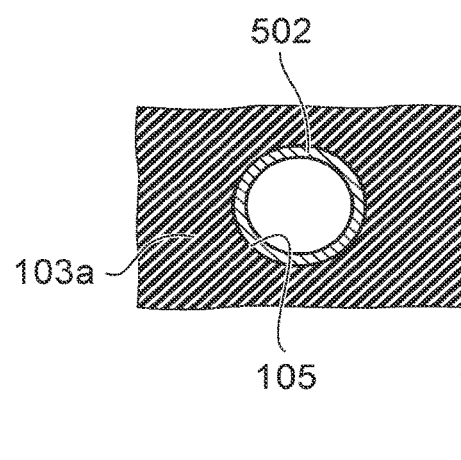
Figure 20C:
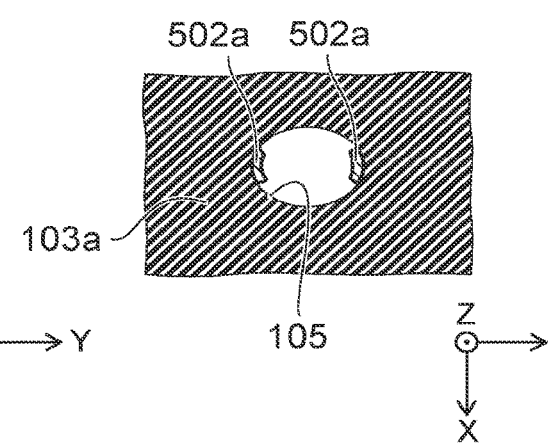

Subsequently, as shown in FIG. 20A through FIG. 20C, a part of the sacrifice film 502 is removed using an isotropic etching process such as a chemical dry etching process. The etching condition on this occasion is set to the condition in which a part of the sacrifice film 502 larger in curvature radius is higher in etching rate than a part smaller in curvature radius. By the etching process, the sacrifice film 502 on the part large in curvature radius in the side surface of the lower part of the memory hole 105 is removed. On this occasion, a part of the sacrifice film 502 and a reaction product generated in the etching process remain on a part small in curvature radius in the inner side surface of the memory hole 105. Further, in the upper part of the memory hole 105, since the circularity of the memory hole is high, the sacrifice film 502 is roughly evenly etched. Further, since the sacrifice film 502 is formed on the memory hole 105 in such a manner that the higher the part of the memory hole 105 is, the thicker the sacrifice film 502 on the part is, the sacrifice film 502 remains on the inner side surface of the upper part of the memory hole 105. Thus, the sacrifice film 502 and the reaction product remaining on the inner side surface of the memory hole 105 form a sacrifice film 502a.

Subsequently, as shown in FIG. 10A, an isotropic etching process such as a chemical dry etching process is performed on the inner side surface of the memory hole 105. The etching condition on this occasion is set to the condition in which the difference in etching rate between the sacrifice film 502a and the stacked body MLa inside the memory hole 105 is small. It should be noted that it is also possible to etch the sacrifice film 502a and the stacked body MLa without changing the etching condition from the process shown in FIG. 20A. Further, it is also possible to perform the etching process on the sacrifice film 103a, the inter-electrode insulating film 104, and the interlayer insulating film 102 in the condition of the high etching rate, and then perform the etching process on the sacrifice film 502a in the condition of the high etching rate. In this case, it is possible to perform some of the etching processes using the RIE method or the wet etching method. In the case in which the inter-electrode insulating film 104 and the interlayer insulating film 102 include the same material, it is possible to etch both of the inter-electrode insulating film 104 and the interlayer insulating film 102 in the same etching condition.

Using the etching process described above, while removing the sacrifice film 502a, the area of the stacked body MLa exposed from the sacrifice film 502a is made to recede. Thus, the circularity of the lower part of the memory hole 105 is improved. Further, since the upper part of the memory hole 105 is covered with the sacrifice film 502a, the hole diameter is not increased by the etching process. In contrast, since the lower part of the memory hole 105 includes a part exposed from the sacrifice film 502a, and in addition, the film thickness of the sacrifice film 502a is thinner compared to the film thickness of the sacrifice film 502a in the upper part, the hole diameter is increased by the etching process. Thus, the difference in the hole diameter between the upper part and the lower part of the memory hole 105 decreases. The aspect ratio of the memory hole 105 is, for example, not less than 50.

Subsequently, by forming the memory film 301 and the pillar 401 using a public-known method, and performing substantially the same process as in the first embodiment, the integrated circuit device according to the embodiment is manufactured. Then, advantages of the embodiment will be explained.

In the embodiment, it is possible to process the memory hole 105, which has been formed in the stacked body MLa and has a roughly tapered shape, so as to have a shape approximate to a roughly cylindrical shape. In other words, in the case in which the hole diameter of the lower part of the memory hole 105 is smaller than the hole diameter of the upper part, it is possible to increase the hole diameter of the lower part. In the case of the embodiment, it become easy to form the memory film 301 and the pillar 401 compared to the case of forming the memory film 301 and the pillar 401 while keeping the shape of the memory hole 105 in the roughly tapered shape.

Other advantages are substantially the same as those of the first embodiment described above.

Variation of Second Embodiment

Then, a variation of the second embodiment will be explained.
The configuration of the integrated circuit device according to the variation is substantially the same as in the second embodiment.

Then, a method for manufacturing the integrated circuit device according to the variation will be explained.

FIG. 21A through FIG. 22C are process cross-sectional views illustrating the method for manufacturing the integrated circuit device according to the variation.

Figure 22A:
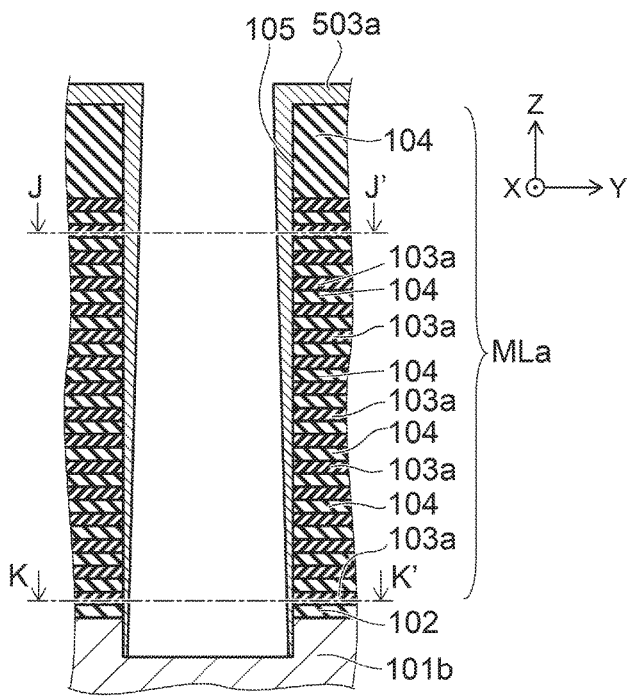

FIG. 21A and FIG. 22A each show an area corresponding to the area A shown in FIG. 1.

FIG. 21B is a cross-sectional view in the J-J' line shown in FIG. 21A, and FIG. 21C is a cross-sectional view in the K-K' line shown in FIG. 21A.

Figure 22B:
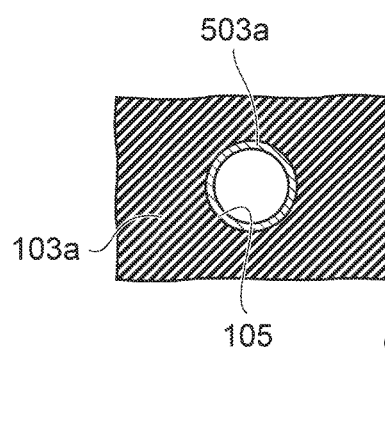
Figure 22C:
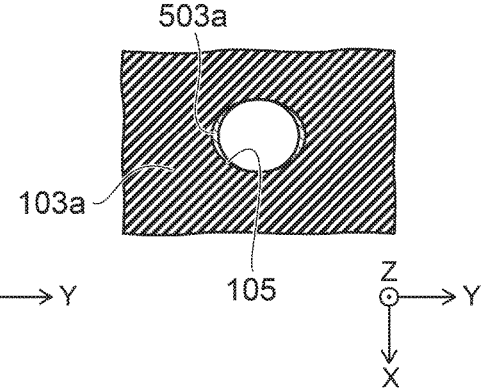

FIG. 22B is a cross-sectional view in the J-J' line shown in FIG. 22A, and FIG. 22C is a cross-sectional view in the K-K' line shown in FIG. 22A.

Firstly, the process shown in FIG. 5A through FIG. 7C is performed similarly to the first embodiment.

Subsequently, as shown in FIG. 21A through FIG. 21C, a sacrifice film 503 is formed on the inner side surface of the memory hole 105 in the condition of the low embeddability. Thus, the higher the part of the memory hole 105 is, the thicker the sacrifice film 503 on the part is, and the lower the part is, the thinner the sacrifice film 503 on the part is.

The sacrifice film 503 is formed using a material including polysilicon. Further, the sacrifice film 503 can also be formed using a material including a silicon oxide, a material including a silicon nitride, a material including germanium, or a material including tungsten.

Subsequently, as shown in FIG. 22A through FIG. 22C, a part of the sacrifice film 503 is removed using an isotropic etching process such as a chemical dry etching process. The etching condition on this occasion is set to the condition in which a part of the sacrifice film 503 larger in curvature radius is higher in etching rate than a part smaller in curvature radius.

By the etching process, the sacrifice film 503 on the part large in curvature radius in the side surface of the lower part of the memory hole 105 is removed. On this occasion, a part of the sacrifice film 503 and a reaction product generated in the etching process remain on a part small in curvature radius in the inner side surface of the memory hole 105.

Further, since the sacrifice film 503 is formed on the memory hole 105 in such a manner that the higher the part of the memory hole 105 is, the thicker the sacrifice film 503 on the part is, the sacrifice film 503 also remains on the inner side surface of the upper part of the memory hole 105.

Thus, the sacrifice film 503 and the reaction product remaining on the inner side surface of the memory hole 105 form a sacrifice film 503a.

Subsequently, similarly to the first embodiment, an isotropic etching process such as a chemical dry etching process is performed on the inner side surface of the memory hole 105. As shown in FIG. 10A, using the etching process described above, while removing the sacrifice film 503a, the area of the stacked body MLa exposed from the sacrifice film 503a is made to recede. Thus, the circularity of the lower part of the memory hole 105 is improved. Further, since the upper part of the memory hole 105 is covered with the sacrifice film 503a, the hole diameter is not increased by the etching process. In contrast, in the lower part of the memory hole 105, the part of the stacked body MLa exposed from the sacrifice film 503a is processed. Thus, it is possible to improve the circularity of the lower part of the memory hole 105 while suppressing the influence of the etching on the upper part of the memory hole 105.

The aspect ratio of the memory hole 105 on this occasion is, for example, not less than 50.

Subsequently, the memory film 301 and the pillar 401 are formed inside the memory hole 105. Subsequently, the integrated circuit device according to the variation is manufactured using a public-known method similarly to the second embodiment.

The integrated circuit device according to the variation is manufactured by the process described hereinabove.

Then, advantages of the variation will be explained.

In the variation, it is possible to improve the circularity of the lower part while suppressing the increase in the hole diameter in the upper part of the memory hole 105.

Other advantages than the advantage described above are substantially the same as those of the first embodiment.

Third Embodiment

Then, a third embodiment will be explained.
The configuration of the integrated circuit device according to the embodiment is substantially the same as in the first embodiment.

Then, a method for manufacturing the integrated circuit device according to the embodiment will be explained.

FIG. 23A through FIG. 24C are process cross-sectional views illustrating the method for manufacturing the integrated circuit device according to the embodiment.

Figure 23A:
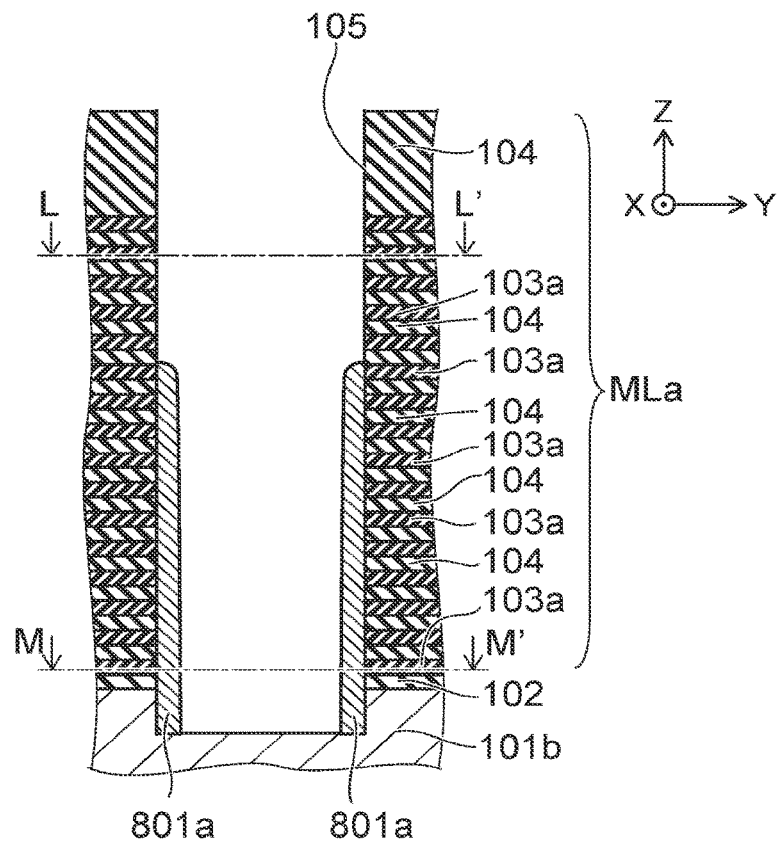
FIG. 23A through FIG. 24C are process cross-sectional views illustrating a method for manufacturing an integrated circuit device according to a third embodiment.
Figure 24A:
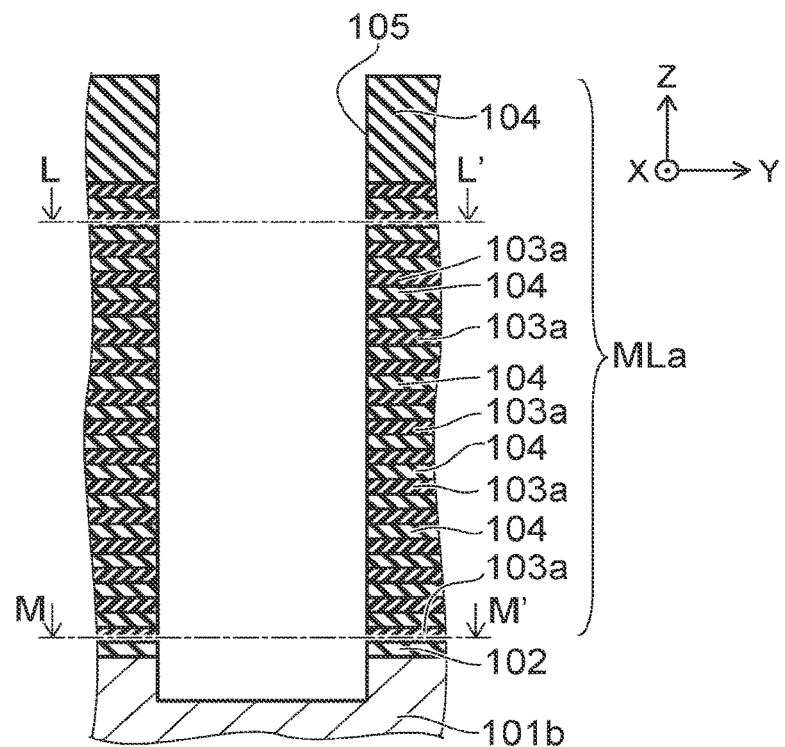

FIG. 23A and FIG. 24A each show an area corresponding to the area A shown in FIG. 1.

Figure 23B:
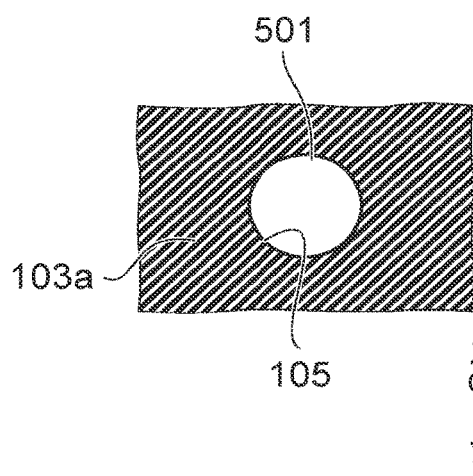
Figure 23C:
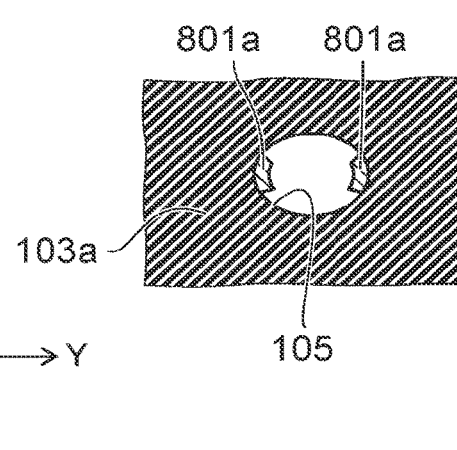

FIG. 23B is a cross-sectional view in the L-L' line shown in FIG. 23A, and FIG. 23C is a cross-sectional view in the M-M' line shown in FIG. 23A.

Figure 24B:
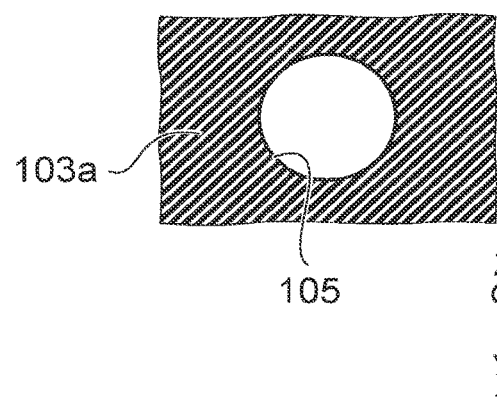
Figure 24C:
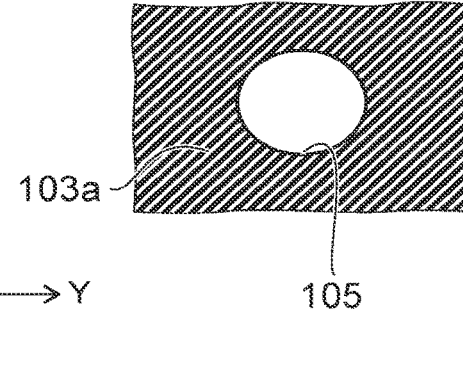

FIG. 24B is a cross-sectional view in the L-L' line shown in FIG. 24A, and FIG. 24C is a cross-sectional view in the M-M' line shown in FIG. 24A.

Firstly, the process shown in FIG. 5A through FIG. 7C is performed similarly to the first embodiment.

Subsequently, as shown in FIG. 23A through FIG. 23C, the inner side surface of the memory hole 105 is processed using an isotropic etching process such as a chemical dry etching process. In other words, the etching process is performed without forming the sacrifice film such as a film including polysilicon on the inner side surface of the memory hole 105. The etching process on this occasion is performed in the condition of the low etching rate with respect to the stacked body MLa and the interlayer insulating film 102. Due to the etching process, the reaction product generated in the etching process selectively adheres to the part small in curvature radius inside the memory hole 105. Thus, a sacrifice film 801a is selectively formed on the inner side surface small in curvature radius in the lower part of the memory hole 105.

Subsequently, as shown in FIG. 24A through FIG. 24C, using an isotropic etching process such as a chemical dry etching process, the memory hole 105 is processed while removing the sacrifice film 801a. The etching process on this occasion is performed in the condition in which the stacked body MLa and the interlayer insulating film 102 are higher in the etching rate than the sacrifice film 801a. Subsequently, the sacrifice layer 801a is selectively removed. Further, the etching process on this occasion can also be performed in the same condition as the etching condition in the process shown in FIG. 23A through FIG. 23C. By the etching process, the circularity of the lower part of the memory hole 105 is improved. Further, it is also possible to perform the etching process on the sacrifice film 103a, the inter-electrode insulating film 104, and the interlayer insulating film 102 in the condition of the high etching rate, and then perform the etching process on the sacrifice film 801a in the condition of the high etching rate. In this case, it is possible to perform some of the etching processes using the RIE method or the wet etching method. In the case in which the inter-electrode insulating film 104 and the interlayer insulating film 102 include the same material, it is possible to etch both of the inter-electrode insulating film 104 and the interlayer insulating film 102 in the same etching condition.

Subsequently, the integrated circuit device according to the embodiment is manufactured by performing substantially the same process as in the first embodiment.

Then, advantages of the embodiment will be explained.

In the embodiment, the sacrifice film 801a for covering the part small in curvature radius is formed using the reaction product generated when performing the isotropic etching process such as a chemical dry etching process. Since it is possible to eliminate the process of covering the inside of the memory hole 105 with the sacrifice film such as a film including polysilicon, the manufacturing cost can be reduced.

Other advantages are the same as those of the first embodiment.

It should be noted that although in each of the embodiment and the variation thereof, there is shown the example of forming a hole in the stacked film and then improving the circularity of the hole, even in the case of forming a hole in a single layer film, it is also possible to improve the circularity of the hole similarly to the embodiments. Further, it is also possible to reduce the roughness of the slit 111 using the method shown in the second embodiment, the variation of the second embodiment, and the third embodiment.

According to the embodiments explained hereinabove, it is possible to realize the method for manufacturing the integrated circuit device suppressing the electric field concentration.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A method for manufacturing an integrated circuit device, comprising:
    forming a first film on a substrate;
    forming a mask member on the first film, the mask member having a pattern;
    performing a first etching on the first film using the mask member as a mask to form a recessed section in the first film;
    forming a second film covering an inner side surface of the recessed section, the second film having a film thickness that prevents blockage of the recessed section; and
    performing a second etching on the second film and the first film via the recessed section,
    the performing of the second etching having a condition of an etching rate at a place smaller in curvature radius in the recessed section being lower than an etching rate at a place larger in curvature radius in the recessed section.

2. The method according to claim 1, further including performing a third etching on the second film and the first film after the performing of the second etching in a condition of a difference between the etching rate of the second film and the etching rate of the first film being smaller than a difference between the etching rate of the second film and the etching rate of the first film in the performing of the third etching.

3. The method according to claim 1, wherein the first film includes one or more substances selected from a group consisting of silicon, titanium, tungsten, silicon nitride, and germanium.

4. The method according to claim 1, wherein the second film includes one or more materials selected from a group consisting of silicon, an insulating material, and germanium.

5. The method according to claim 1, wherein
    the first film includes a plurality of third films each having a first composition and a plurality of fourth films each having a second composition, and
    the forming of the first film includes alternately stacking the plurality of third films and the plurality of fourth films.

6. The method according to claim 1, wherein the recessed section is shaped like a cylindrical hole.

7. The method according to claim 1, wherein the recessed section is shaped like a trench.

8. A method for manufacturing an integrated circuit device, comprising:
    forming a first film on a substrate;
    forming a mask member on the first film, the mask member having a pattern;
    performing a first etching on the first film using the mask member as a mask to form a recessed section in the first film;
    forming a second film covering an inner side surface of the recessed section, the second film having a film thickness that prevents blockage of the recessed section, and decreasing toward a bottom of the recessed section; and
    performing a second etching on the second film in a condition of an etching rate with respect to an area smaller in curvature radius in an inner surface of the recessed section being lower than an etching rate with respect to an area larger in curvature radius in the inner surface of the recessed section.

9. The method according to claim 8, wherein the first film includes one or more substances selected from a group consisting of silicon, titanium, tungsten, silicon oxide, silicon nitride, and germanium.

10. The method according to claim 8, wherein the second film includes one or more substances selected from a group consisting of silicon, titanium, tungsten, silicon oxide, silicon nitride, and germanium.

11. The method according to claim 8, wherein
the first film includes a plurality of third films each having a first composition and a plurality of fourth films each having a second composition, and
the forming of the first film includes alternately stacking the plurality of third films and the plurality of fourth films.

* * * * *